US006746901B2

(12) United States Patent
Kasahara et al.

(10) Patent No.: US 6,746,901 B2
(45) Date of Patent: Jun. 8, 2004

(54) SEMICONDUCTOR DEVICE AND METHOD OF FABRICATING THEREOF

(75) Inventors: Kenji Kasahara, Atsugi (JP); Ritsuko Kawasaki, Atsugi (JP); Hisashi Ohtani, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 272 days.

(21) Appl. No.: 09/847,596

(22) Filed: May 3, 2001

(65) Prior Publication Data

US 2002/0017685 A1 Feb. 14, 2002

(30) Foreign Application Priority Data

May 12, 2000 (JP) ........................................ 2000-139844

(51) Int. Cl.$^7$ .............................................. H01L 21/00
(52) U.S. Cl. ........................ 438/149; 438/151; 438/197; 438/166; 438/479; 438/487; 438/517
(58) Field of Search ................................. 438/197, 160, 438/166, 149, 128, 151, 153, 154, 157, 283, 479, 48, 517, 164, 301, 487, 585, 593

(56) References Cited

U.S. PATENT DOCUMENTS

| 4,888,632 | A | * | 12/1989 | Haller .......................... 257/60 |
| 5,254,488 | A | * | 10/1993 | Haller .......................... 438/160 |
| 5,550,070 | A | * | 8/1996 | Funai et al. .................. 438/486 |
| 5,637,512 | A | * | 6/1997 | Miyasaka et al. ............ 438/166 |
| 5,643,825 | A |   | 7/1997 | Gardner et al. |
| 5,780,903 | A | * | 7/1998 | Tsai et al. .................... 257/344 |
| 5,859,683 | A | * | 1/1999 | Tagusa et al. ............... 349/138 |
| 5,893,730 | A |   | 4/1999 | Yamazaki et al. |
| 5,894,159 | A | * | 4/1999 | Mori et al. ................... 257/406 |
| 5,897,346 | A | * | 4/1999 | Yamaguchi et al. ......... 438/162 |
| 5,923,962 | A |   | 7/1999 | Ohtani et al. |
| 5,943,593 | A |   | 8/1999 | Noguchi et al. |
| 6,010,923 | A | * | 1/2000 | Jinno ........................... 438/158 |
| 6,133,073 | A |   | 10/2000 | Yamazaki et al. |
| 6,291,275 | B1 |  | 9/2001 | Yamazaki et al. |
| 6,309,917 | B1 | * | 10/2001 | Furuta et al. ................ 438/149 |
| 6,458,637 | B1 |  | 10/2002 | Yamazaki et al. |

FOREIGN PATENT DOCUMENTS

| EP | 0 651 431 A2 | 5/1995 |
| JP | 07-183540 | 7/1995 |

OTHER PUBLICATIONS

Ishihara et al., "Location–Controlled Adjacent Grains Following Excimer–Laser Melting of Si Thin–Films", AM–LCD '98, pp. 153–156.

* cited by examiner

Primary Examiner—David Nelms
Assistant Examiner—Andy Huynh
(74) Attorney, Agent, or Firm—Eric J. Robinson; Robinson Intellectual Property Law Office, P.C.

(57) ABSTRACT

To realize TFT enabling high-speed operation by fabricating a crystalline semiconductor film in which positions and sizes of crystal grains are controlled and using the crystalline semiconductor film in a channel forming region of TFT, a film thickness is stepped by providing a stepped difference in at least one layer of a matrix insulating film among a plurality of matrix insulating films having refractive indices different from each other. By irradiating laser beam from a rear face side of a substrate (or both sides of a surface side and the rear face side of the substrate), there is formed an effective intensity distribution of laser beam with regard to a semiconductor film and there is produced a temperature gradient in correspondence with a shape of the stepped difference and a distribution of the film thickness of the matrix insulating film in the semiconductor film. By utilizing thereof, a location of producing lateral growth and a direction thereof can be controlled to thereby enable to provide crystal grains having large particle sizes.

6 Claims, 18 Drawing Sheets

TEMPERATURE HISTORY AT RESPECTIVE POINTS OF FIG. 1A

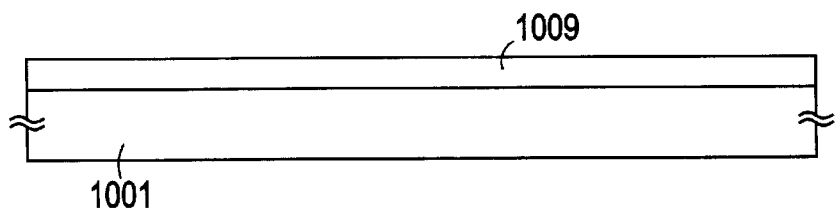
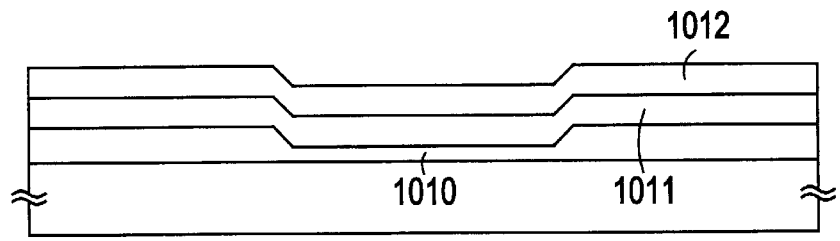
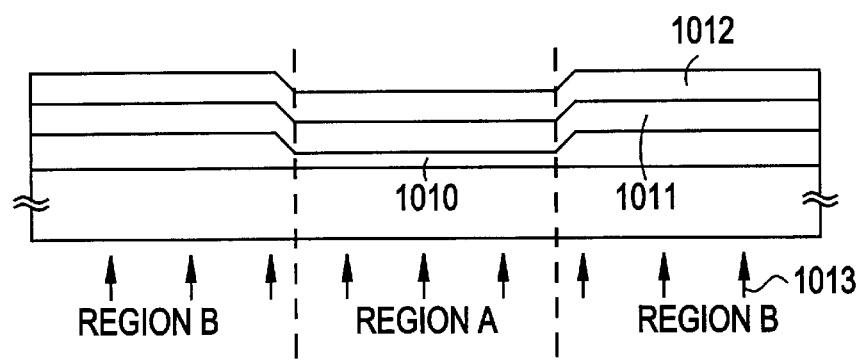
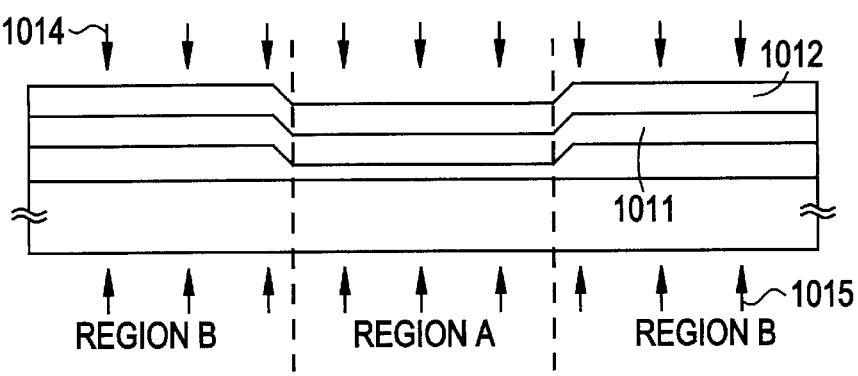
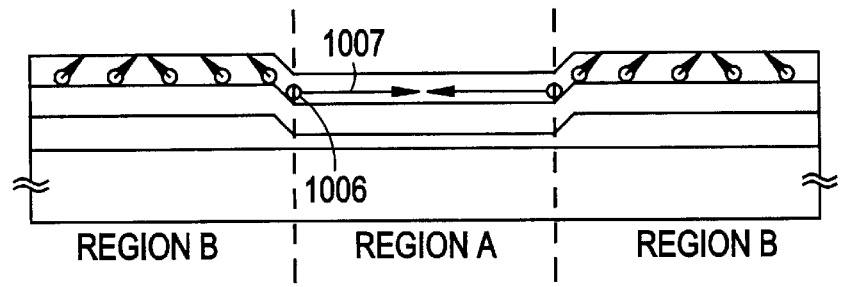

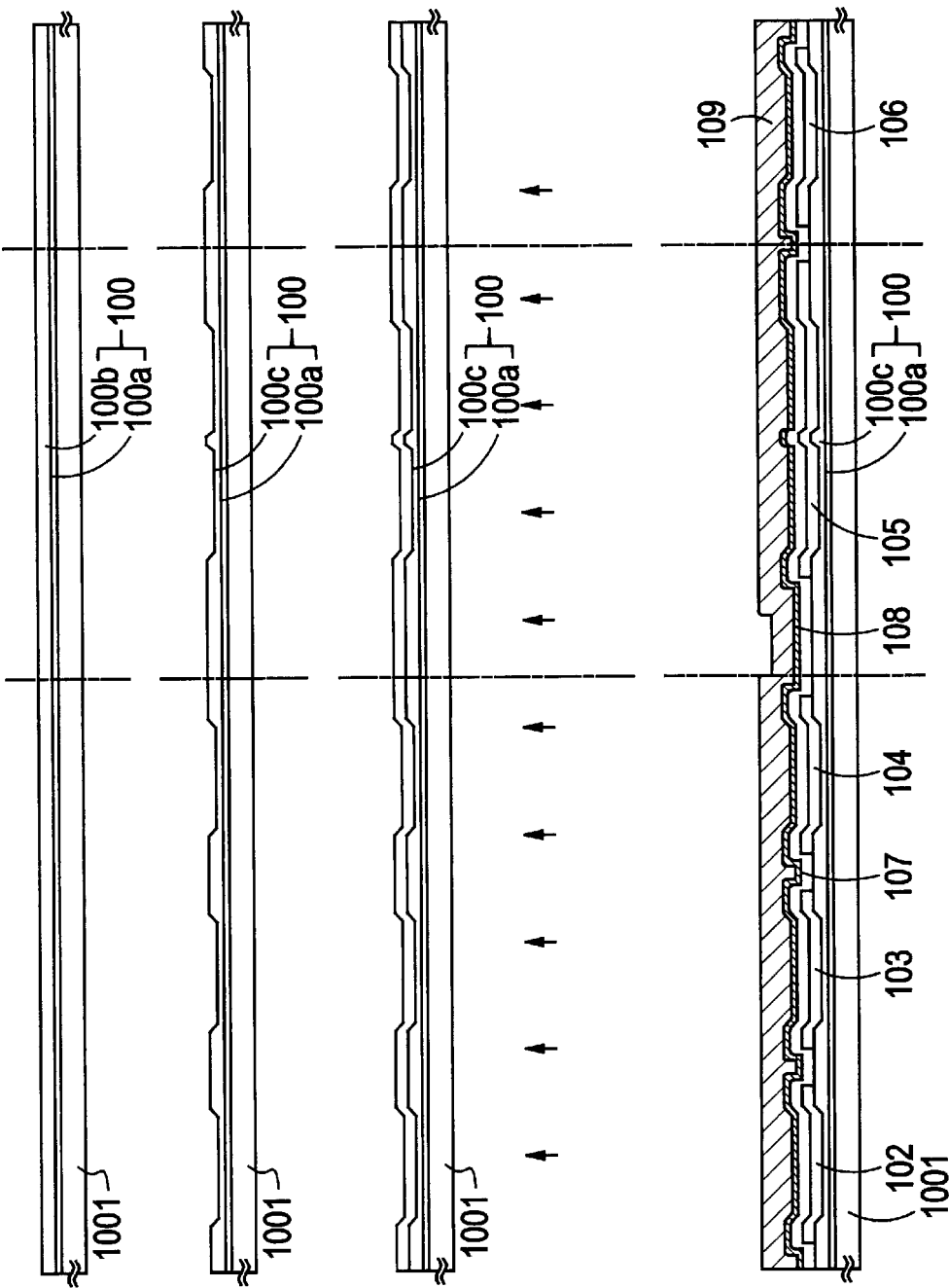

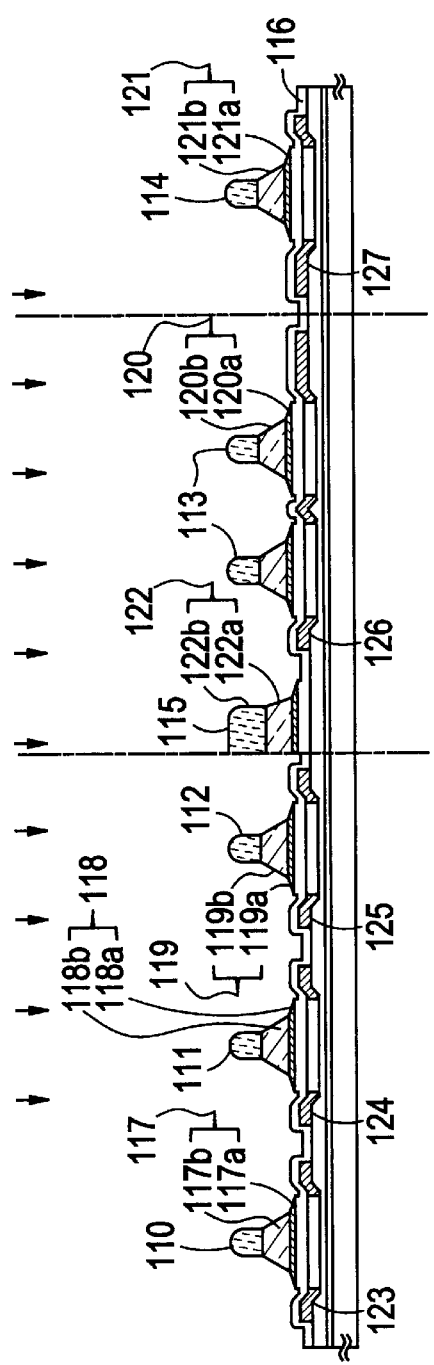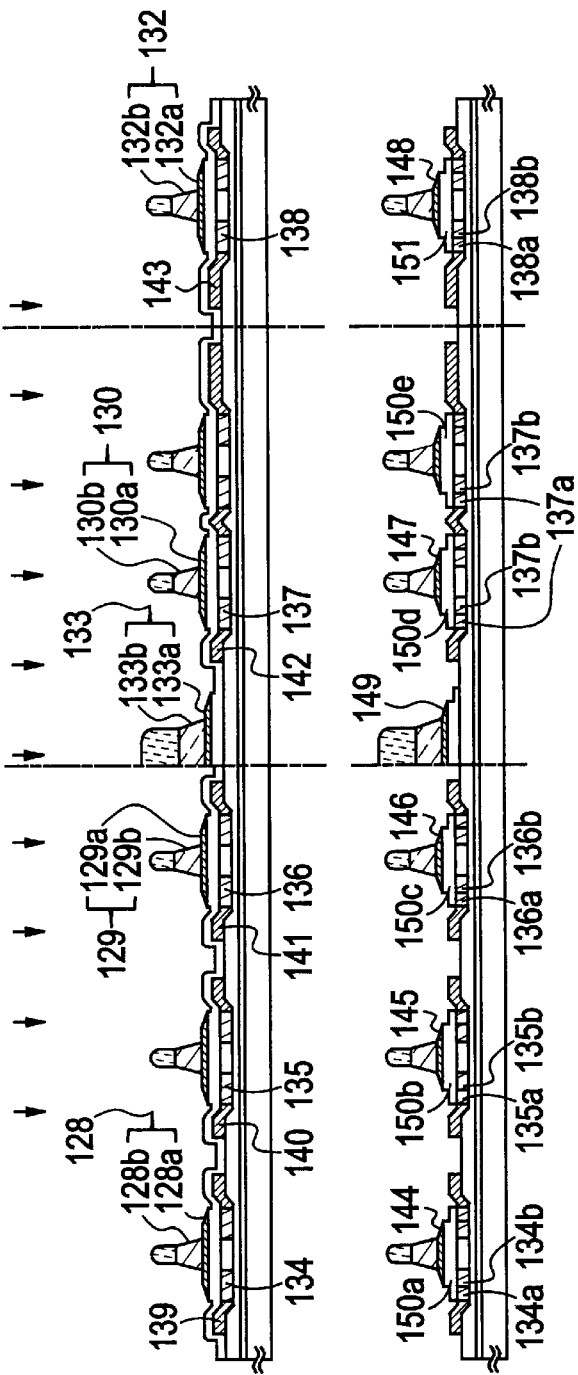
FIG. 12A
FIG. 12B
FIG. 12C

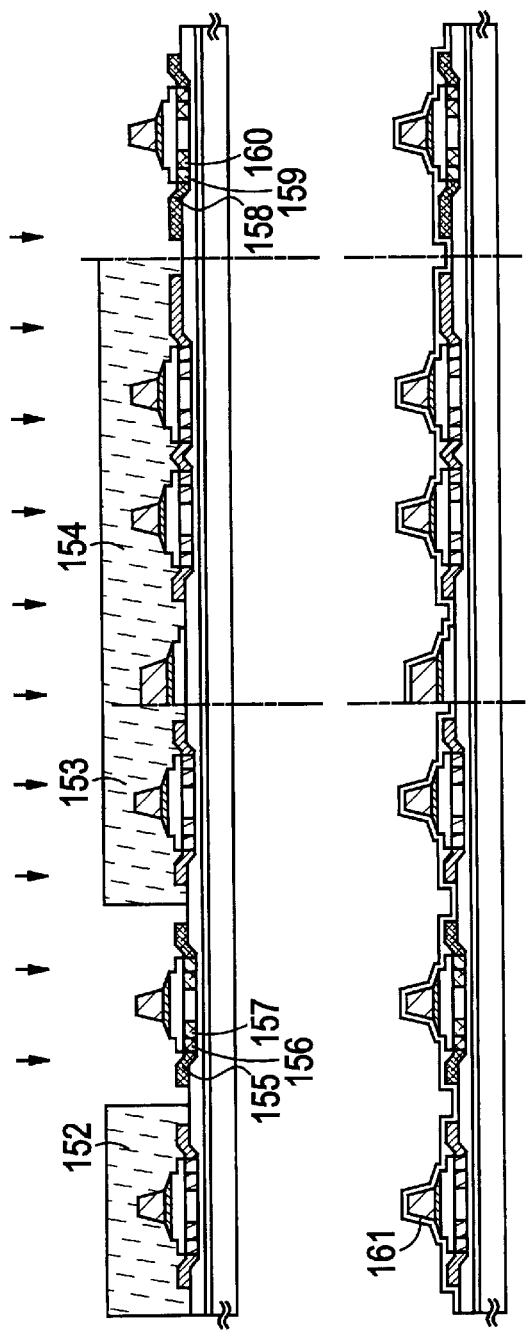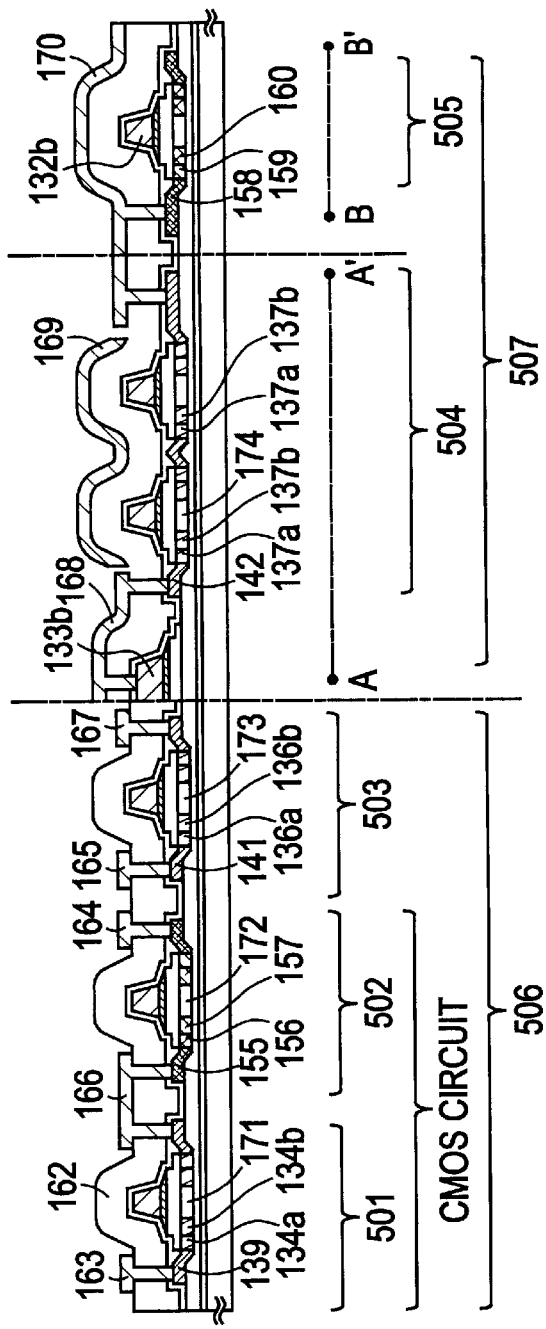

Projection Apparatus (Three Plates Types)

Light Source Optical System

SEMICONDUCTOR DEVICE AND METHOD OF FABRICATING THEREOF

BACKGROUND OF THE INVENTION

1. Field of the Invention

The present invention relates to a method of fabricating a semiconductor device having a circuit constituted by a thin film transistor (herein after, referred to as TFT). For example, the invention relates to an electro-optic apparatus represented by a liquid crystal display apparatus and a constitution of an electric apparatus mounted with an electro-optic apparatus as a part thereof. Further, the invention relates to a method of fabricating the device. Further, in the specification, a semiconductor device generally indicates an apparatus capable of functioning by utilizing semiconductor properties and an electro-optic apparatus and an electric apparatus, mentioned above, pertain to the category.

2. Description of the Related Art

In recent years, there have been widely carried out researches on a technology in which an amorphous semiconductor film formed above an insulating substrate of glass or the like is subjected to laser annealing to thereby crystallize the amorphous semiconductor and promoting crystalline performance thereof. Silicon is frequently used for the amorphous semiconductor film.

In comparison with a synthesized quartz glass substrate which has frequently be used conventionally, a glass substrate is provided with advantages that the glass substrate is inexpensive and rich in workability and the glass substrate having a large area can easily be fabricated. This is the reason that the above-described researches are carried out. Further, laser is preferably used in crystallizing the amorphous semiconductor since the melting point of the glass substrate is low. Laser can provide high energy only to an amorphous semiconductor film without considerably elevating temperature of a substrate.

Since a crystalline semiconductor is constituted by a number of crystal grains, a film thereof is referred also as a polycrystal semiconductor film. A crystalline semiconductor film formed by being subjected to laser annealing is provided with high mobility and therefore, a thin film transistor (TFT) is formed by using the crystalline semiconductor film and the crystalline semiconductor film is intensively utilized in, for example, a liquid crystal electro-optic apparatus of a monolithic type in which TFTs for driving a pixel and for a drive circuit are fabricated above one sheet of a glass substrate.

Further, there is preferably used a method of carrying out laser annealing by shaping pulse laser beam such as excimer laser to constitute a square spot of several centimeters square or a linear shape having a length equal to or larger than 10 cm at an irradiated face and scanning the laser beam (or moving an irradiated position of laser beam relatively to an irradiated face) since the method is provided with high productivity and is excellent industrially.

Particularly, when linear beam is used, the productivity is high since different from a case of using laser beam in a shape of a spot where scanning in front and rear direction and left and right direction is needed, laser can be irradiated to a total of an irradiated face by scanning the linear beam only in a direction orthogonal to a longitudinal direction thereof. Laser is scanned in the direction orthogonal to the longitudinal direction since the direction is the most efficient scanning direction. Owing to the high productivity, currently, the main stream is being established by using linear beam produced by shaping pulse oscillated excimer laser beam by a pertinent optical system. The technology enables to provide a monolithic type liquid crystal display apparatus formed with TFT (pixel TFT) forming a pixel portion and TFT of a drive circuit provided at a periphery of the pixel portion above one sheet of the substrate.

However, a crystalline semiconductor film fabricated by the laser annealing process, is formed by aggregating a plurality of crystal grains and positions and sizes of the crystal grains are at random. According to TFT fabricated above the glass substrate, for element isolation, the crystalline semiconductor is formed to isolate by patterning in an insular shape. In that case, the crystalline semiconductor cannot be formed by designating positions and sizes of crystal grains. In contrast to inside of a crystal grain, at an interface of the crystal grain (grain boundary), there are numerously present recombination centers and trap centers caused by an amorphous structure or crystal defect. It is known that when a carrier is trapped by the trap center, the potential of the crystal grain is elevated to thereby constitute a barrier against carrier and accordingly, a current transportation characteristic of the carrier is deteriorated. Although the crystalline performance of a semiconductor film at a channel forming region, effects various influence on electric properties of TFT, it is almost impossible to form the channel forming region by a single crystal of semiconductor film by excluding the influence of the grain boundary.

In order to resolve such a problem, according to the laser annealing process, there have been carried out various trials for forming a crystal grain the position of which is controlled and which is provided with a large grain size. Here, an explanation will firstly be given of a procedure of solidifying the semiconductor film after irradiating the semiconductor film with laser beam.

It takes a certain degree of time until solid phase nuclei are generated in a liquid semiconductor film which is completely melted by irradiating the laser beam and the procedure of solidifying the liquid semiconductor film is finished by generating numerous uniform (or nonuniform) nuclei in a completely melted region and growing crystals therefrom. Positions and sizes of crystal grains provided in this case are at random.

Further, when the semiconductor film is not completely melted by irradiating the laser beam and a solid phase semiconductor region partially remains, crystal growth is started from the solid phase semiconductor region immediately after irradiating the laser beam. As has already been mentioned, it takes a certain degree of time to generate nuclei in the completely melted region. Therefore, during a time period until nuclei are generated in the completely melted region, by moving a solid/liquid interface (which designates an interface between the solid phase semiconductor region and the completely melted region and corresponds to a front end of growth of crystal nucleus) constituting the front end of the crystal growth in a direction in parallel with a film face of the semiconductor film (hereinafter, referred to as lateral direction), the crystal grain grows to a length several tens times as much as a film thickness. Such a growth is finished by generating numerous uniform (or nonuniform) nuclei in the completely melted region and growing crystals. Hereinafter, the phenomenon is referred to as super lateral growth.

Also in an amorphous semiconductor film or a crystalline semiconductor film, there is present an energy region of laser beam realizing the super lateral growth. However, the energy region is very narrow, further, a position of providing a crystal grain having a large grain size cannot be controlled. Further, a region other than crystal grains having large grain sizes, is a microcrystal region generating numerous nuclei or an amorphous region.

As has already been explained above, when a temperature gradient in the lateral direction can be controlled (heat flow in the lateral direction can be produced) in the energy region of laser beam for completely melting the semiconductor film, a position of growing a crystal grain and a direction of growing thereof can be controlled. There have been carried out various trials in order to realize the method.

For example, there is a report with regard to a laser annealing process in which a metal film having a high melting point is formed between a substrate and a silicon oxide film of a matrix, an amorphous silicon film is formed above the metal film having the high melting point and laser beam of excimer laser is irradiated from both sides of a surface side of the substrate (defined as a face formed with the film in the specification) and a rear face side (defined as a face on a side opposed to the face formed with the film in the specification), in "R. Ishihara and A. Burtsev: AM- LCD '98., p153–p156, 1998". The laser beam irradiated from the surface side of the substrate is absorbed by the silicon film and is converted into heat. Meanwhile, the laser beam irradiated from the rear face side of the substrate is absorbed by the metal film having the high melting point and converted into heat to thereby heat the metal film having the high melting point at high temperature. The silicon oxide film between the heated metal film having the high melting point and the silicon film, is operated as a layer for storing heat and therefore, a cooling rate of the molten silicon film can be retarded. It is reported that by forming the metal film having the high melting point at an arbitrary location, there can be provided a crystal grain having a diameter of 6.4 $\mu$m at maximum at the arbitrary location.

Further, James S. Im et al of Columbia University show a Sequential Lateral Solidification method (hereinafter, referred to as SLS method) capable of realizing super lateral growth at an arbitrary location. According to the SLS method, crystallization is carried out by shifting a mask in a slit-like shape at every shot by about a distance of carrying out the super lateral growth (about 0.75 $\mu$m).

A description has been given by the inventors of a method of carrying out large particle size formation of a crystal grain by providing a stepped difference at a matrix in Japanese Patent Application No. 351060/1999. Here, an explanation will be given of the method.

FIG. 1A shows a first sample when a stepped difference is provided at a matrix insulating film. In the first sample, a silicon oxynitride film (A-type) is formed on a synthesized quartz glass substrate and an amorphous silicon film is formed on the silicon oxynitride film (A-type). A stepped difference is provided at the silicon oxynitride film (A-type) constituting the matrix insulating film to thereby provide a portion having a thin film thickness and a portion having a thick film thickness. In this case, according to the specification, the silicon oxynitride film (A-type) is a silicon oxynitride film having composition ratios of Si=32%, O=59%, N=7% and H=2% and a silicon oxynitride film (B-type) is a silicon oxynitride film having compositions ratios of Si=32%, O=27%, N=24% and H=17%. With regard to the first sample, there is carried out a heat conduction analysis simulation when the amorphous silicon film is crystallized by irradiating laser beam from a surface side of the substrate. The result is shown in FIG. 1B. As conditions used in carrying out the calculation, a wavelength of the laser beam is set to 308 nm, irradiation energy is set to 400 mJ/cm$^2$, a pulse width (a time period of outputting the laser beam) is set to 30 ns and the laser beam is irradiated in vacuum. Table 1 shows other parameters used in the calculation.

The result shown by FIG. 1B is provided since temperature gradient is produced because the matrix insulating film is operated as a heat capacitance. Region B of FIG. 1A is cooled faster than other location since there are both of (1) the matrix insulating film right thereunder and (2) the matrix insulating film present in the lateral direction as locations of escaping heat. Conversely, at region C, temperature is difficult to lower since there is heat escaping from region B to the matrix insulating film right under region C. Therefore, temperature gradient is produced between region B and region C or between region B and region A. By producing the temperature gradient, crystal growth is started from region B having low temperature, a solid/liquid interface is moved to region C or region A having high temperature and accordingly, a crystal grain having a large particle size can be obtained.

That is, a structure used in TFT fabricated above a conventional glass substrate, that is, a structure forming a matrix insulating film on the glass substrate and forming a semiconductor film on the matrix insulating film, stays unchanged, however, in Japanese Patent Application No. 351060/1999, the stepped difference is provided by etching the matrix insulating film at a desired position. When laser beam is irradiated from the surface side of the substrate to the sample, a temperature distribution is produced at an inner portion of the semiconductor film in correspondence with a shape of the stepped difference of the matrix insulating film and a location and a direction of producing lateral growth can be controlled.

It is structurally possible to fabricate TFT of a top gate type with the semiconductor film formed by the method of R. Ishihara et al as an activation layer. However, there is produced a parasitic capacitance by the silicon oxide film provided between the semiconductor film and the metal film having a high melting point and accordingly, power consumption is increased and it is difficult to realize high-speed operation of TFT. Meanwhile, it seems that by constituting a gate electrode by the metal film having a high melting point, the method is effectively applicable to TFT of a bottom gate type or an inverse stagger type. However,in the case of the structure forming the silicon oxide film on the substrate, forming the metal film having high melting point on the silicon oxide film and forming the amorphous silicon film on the metal film having a high melting point, even when a consideration is given thereto by excluding a film thickness of the amorphous silicon film, with regard to film thicknesses of the metal film having a high melting point and the silicon oxide film, film thickness suitable in a crystalline step and film thickness suitable in electric properties of TFT element, do not necessarily coincide with each other and therefore, it is not possible to simultaneously satisfy both of optimum design in the crystalline step and optimum design of the element structure.

Further, when the metal film having a high melting point which is not provided with light transmitting performance, is formed over an entire face of the glass substrate, a transmission type liquid crystal display apparatus cannot be fabricated. A chromium (Cr) film or a titanium (Ti) film used as a metal material having a high melting point, is provided with high internal stress and therefore, there is a high possibility of posing a problem in adherence with the glass substrate. Further, there is a high possibility that influence of the internal stress is effected also to the semiconductor film formed thereabove and is operated as a force causing strain in the formed crystalline semiconductor film.

Meanwhile, in order to control threshold voltage (hereinafter, described as Vth) constituting an important parameter in TFT in a predetermined range, it is necessary to consider a reduction in a charging detect density of a matrix film or a gate insulting film formed by an insulting film in close contact with the activation layer and balance of the internal stress other than electron charging control of the channel forming region. A material including silicon as a constituent element as in the silicon oxide film or the silicon oxynitride film, is suitable to meet such a request. Therefore, there is a concern of deteriorating the balance by providing the metal film having a high melting point between the substrate and the matrix film.

Further, according to the SLS method, fine control by a unit of micrometer is needed in a technology of positioning a mask relative to the substrate and there is constituted an apparatus which is more complicated than an ordinary laser irradiating apparatus. Further, there poses a problem in throughput when the SLS method is used in fabricating TFT applied to a liquid crystal display having a large area region.

SUMMARY OF THE INVENTION

The invention provides a technology for resolving such a problem, fabricating a crystalline semiconductor film controlling positions and sizes of crystal grains and realizing TFT capable of carrying out high-speed operation by using the crystalline semiconductor film in a channel forming region of TFT. Further, it is an object of the invention to provide a technology capable of applying such TFT to various semiconductor apparatus such as transmission type liquid crystal display apparatus or display apparatus using an electroluminescent material. The EL (electroluminescent) material referred to in this specification include triplet-based light emission materials and/or singlet-based light emission materials, for example.

A simulation is carried out by using a second sample forming a silicon nitride film on a synthesized quartz glass substrate, forming a silicon oxynitride film (A-type) on the silicon nitride film and forming an amorphous silicon film having a film thickness of 55 nm on the silicon oxynitride film (A-type). FIGS. 2A and 2B and FIGS. 3A and 3B show a result of irradiating laser beam from a rear face side of the substrate to the second sample and calculating reflectance of the laser beam with regard to the amorphous silicon film. FIG. 2A shows a calculation result of film thickness dependency of the silicon oxynitride film (A-type) when a film thickness of the silicon nitride film is fixed to 50 nm and FIG. 2B shows a calculation result of film thickness dependency of the silicon nitride film when a film thickness of the silicon oxynitride film (A-type) is fixed to 100 nm. In carrying out the calculation, a wavelength of the laser beam is set to 308 nm and other parameters are shown in Table 1

TABLE 1

|  | Refractive index n | Attenuation coefficient k | Absorption coefficient α [cm$^{-1}$] |
|---|---|---|---|
| Crystalline silicon film | 4.00 | 3.91 | 1.59 × 10$^6$ |
| Amorphous silicon film | 3.53 | 3.30 | 1.35 × 10$^6$ |

TABLE 1-continued

|  | Refractive index n | Attenuation coefficient k | Absorption coefficient α [cm$^{-1}$] |
|---|---|---|---|
| Silicon oxynitride film (A-type) | 1.48 | 0.00 | 0.00 |
| Silicon oxynitride film (B-type) | 1.86 | 0.01 | 2.45 × 10$^3$ |
| Silicon nitride film | 2.14 | 0.01 | 2.45 × 10$^3$ |
| Corning 1737 substrate | 1.57 | 0.00 | 8.98 |
| Synthesized quartz glass | 1.50 | 0.00 | 0.00 |

It is known from FIG. 2A that the reflectance with regard to the amorphous silicon film is periodically changed by changing the film thickness of the silicon oxynitride film (A-type) even with the same irradiation energy of the laser beam. Further, it is known from FIG. 2B that the reflectance with regard to the amorphous silicon film is periodically changed by changing the film thickness of the silicon nitride film even with the same irradiation energy of the laser beam.

Next, FIG. 3A and FIG. 3B show a result of calculation by setting the wavelength of the laser beam to 532 nm with respect to the second sample. FIG. 3A shows a calculation result of film thickness dependency of the silicon oxynitride film (A-type) when the film thickness of the silicon nitride film is fixed to 50 nm and FIG. 3B shows a calculation result of film thickness dependency of the silicon nitride film when the film thickness of the silicon oxynitride film (A-type) is fixed to 100 nm. Further, Table 2 shows parameters used in carrying out the calculation.

TABLE 2

|  | Refractive index n | Attenuation coefficient k | Absorption coefficient α [cm$^{-1}$] |
|---|---|---|---|
| Crystalline silicon film | 4.31 | 0.12 | 2.74 × 10$^4$ |
| Amorphous silicon film | 4.59 | 0.39 | 9.31 × 10$^4$ |
| Silicon oxynitride film (A-type) | 1.48 | 0.00 | 0.00 |
| Silicon oxynitride film (B-type) | 1.79 | 0.00 | 1.22 × 10$^3$ |
| Silicon nitride film | 2.02 | 0.00 | 8.16 × 10$^2$ |
| Corning 1737 substrate | 1.45 | 0.01 | 4.08 × 10$^3$ |
| Synthesized quartz glass | 1.48 | 0.00 | 0.00 |

It is known from FIG. 3A that reflectance with regard to the amorphous silicon film is periodically changed by changing the film thickness of the silicon oxynitride film (A-type) even with the same irradiation energy of the laser beam. Further, it is known from FIG. 3B that the reflectance with regard to the amorphous silicon film is periodically changed by changing the film thickness of the silicon nitride film.

That is, it is known that when the laser beam is irradiated from the rear face side of the substrate, by changing the film thickness of at least one undercoat insulating film among a plurality of the undercoat insulating films having different refractive indices, an effective irradiation intensity of the laser beam with regard to the amorphous silicon film can be changed. Further, it is known that the periodic change of the reflectance with regard to the amorphous silicon film is brought about even if the wavelength of the laser beam is changed. Incidentally, the period of the change of the reflectance differs by the wavelength of the laser beam and the film thickness of the undercoat insulating film.

Next, a simulation is carried out by using a third sample forming a lower layer silicon oxynitride film on a synthesized quarts glass substrate, forming a silicon oxynitride film (A-type) having a film thickness of 100 nm on the lower layer silicon oxynitride film and forming an amorphous silicon film having a film thickness of 55 nm on the silicon oxynitride film (A-type). Further, the lower layer silicon oxynitride film is used for differentiating from the silicon oxynitride film (A-type) or the silicon oxynitride film (B-type) and in the simulation, by changing composition ratios of the lower layer silicon oxynitride film, the refractive index of the lower layer silicon oxynitride film is changed. FIG. 10A shows reflectance with regard to the amorphous silicon film when laser beam having a wavelength of 308 nm is irradiated from a rear face side of the substrate to the third sample. It is known from FIG. 10A that in accordance with a change in the refractive index of the lower layer silicon oxynitride film, the reflectance with respect to the amorphous silicon film is also changed.

Meanwhile, it is known that the reflectance with regard to the amorphous semiconductor film when laser beam having the wavelength of 308 nm is irradiated to a fourth sample forming the silicon oxynitride film (A-type) having the film thickness of 100 nm on the synthesized quartz glass substrate and forming the amorphous silicon film having the film thickness of 55 nm on the silicon oxynitride film (A-type), is 42.5% by reading a case of FIG. 2B when the film thickness of the silicon nitride film is 0 nm. That is, when film quality of the lower layer silicon oxynitride film is made proximate to that of the silicon oxynitride film (A-type) by increasing a rate of nitrogen in the composition ratios of the lower layer silicon oxynitride film, the reflectance of the laser beam with regard to the amorphous silicon film when the undercoat insulating film is constituted by laminating the lower layer silicon oxynitride film and the silicon oxynitride film (A-type), is to a degrees the same as that when the undercoat insulating film is constituted only by the silicon oxynitride film (A-type). That is, it is known that even when undercoat insulating films having refractive indices near to each other are laminated and the film thickness is stepped by providing a stepped difference in one layer of the undercoat insulating films, an intensity distribution of the laser beam in the semiconductor film is not produced and there is not so much significance in the lamination.

Successively, the reflectance with regard to the amorphous silicon film is changed by changing the refractive index of the lower layer silicon oxynitride film by irradiating the laser beam having the wavelength of 532 nm from the rear face side of the substrate to the third sample and changing the composition ratios of the lower layer silicon oxynitride film. The result is shown in FIG. 10B. Meanwhile, it is known that the reflectance with regard to the amorphous semiconductor film when the laser beam having the wavelength of 532 nm is irradiated to the fourth sample, is 10% by reading a case in which the film thickness of the silicon nitride film is 0 nm in FIG. 3B. Also in the case of the laser beam having the wavelength of 532 nm, when the film quality of the lower layer silicon oxynitride film is made proximate to that of the silicon oxynitride film (A-type) by changing the composition ratios of the lower layer silicon oxynitride film, the reflectance with regard to the amorphous silicon film when the undercoat insulating film is constituted by laminating the lower layer silicon oxynitride film and the silicon oxynitride film (A-type), is to a degree the same as that when the undercoat insulating film is constituted by only the silicon oxynitride film (A-type). That is, it is known that also in the case of using the laser beam having the wavelength of 532 nm, even when undercoat insulating films having refractive indices near to each other are laminated and the film thickness is stepped by providing a stepped difference in one layer of the undercoat insulating films, an effective intensity distribution of the laser beam is not produced in the amorphous silicon film and there is not so much significance of the lamination.

Further, it is found from Table 2 that the refractive indices with respect to the wavelength 532 nm of the silicon oxynitride film (A-type), a Corning 1737 substrate and the synthesized quartz glass substrate, are to the same degree. Hence, as the substrate, there is used the Corning 1737 glass substrate or the synthesized quartz glass substrate, there is formed the silicon oxynitride film (A-type) having a stepped film thickness by providing a stepped difference on the substrate, there is formed an amorphous silicon film on the silicon oxynitride film (A-type) and laser beam is irradiated from the rear face side of the substrate. However, since recesses and projections of the surface of the substrate are coarser than the stepped difference provided at the silicon oxynitride film (A-type), even when laser beam is irradiated from the rear face side of the substrate, there is hardly produced an effective intensity distribution of the laser beam in the amorphous silicon film. That is, it is known that it is meaningless that the undercoat insulating film formed on the substrate is provided with the refractive index to the degree the same as that of the substrate with regard to the wavelength of the laser beam used and it is necessary that the refractive index of the undercoat insulating film is different from that of the substrate.

In this way, the reflectance with regard to the amorphous semiconductor film is changed by an interference effect of thin films of a plurality of laminated undercoat insulating films and an arbitrary intensity distribution of laser beam can be provided by combinations of film thicknesses and refractive indices of a plurality of laminated matrix insulating films. From the above-described, according to the invention, by using a plurality of undercoat insulating films and providing at least one layer of the plurality of undercoat insulating films with a step in a film thickness by providing a stepped difference, there can be formed a crystalline semiconductor film having crystal grains which are provided with large particle sizes and positions of which are controlled. Incidentally, in the plurality of undercoat insulating films, there are used at least two kinds of insulating films having different refractive indices and laser beam is irradiated from a rear face side of a substrate or from both sides of a surface side and the rear face side of the substrate.

BRIEF DESCRIPTION OF THE DRAWINGS

FIGS. 5A, 5B, 5C, 5D and 5E are views showing an example of forming an undercoat film and irradiating laser beam disclosed in the invention;

FIGS. 11A, 11B, 11C and 11D are sectional views showing steps of fabricating pixel TFT and TFT of a drive circuit;

FIGS. 12A, 12B and 12C are sectional views showing steps of fabricating the pixel TFT and TFT of the drive circuit;

FIGS. 13A, 13B and 13C are sectional views showing steps of fabricating the pixel TFT and TFT of the drive circuit;

DETAILED DESCRIPTION OF THE PREFERRED EMBODIMENTS

Embodiment 1

Figure 4A:
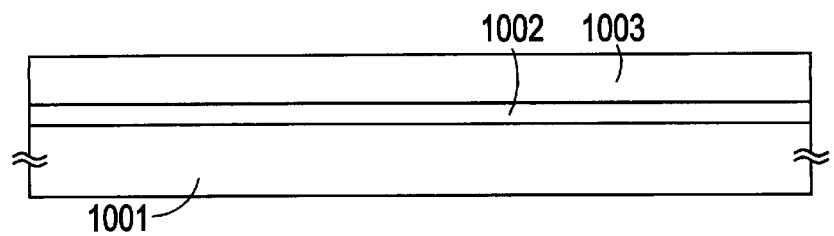
FIGS. 4A, 4B, 4C, 4D and 4E are diagrams showing an example of forming an undercoat film and irradiating laser beam disclosed in the invention.

An explanation will be given of the embodiment in reference to FIGS. 4A, 4B, 4C, 4D and 4E. In FIG. 4A, as a substrate 1001, there is used a nonalkaline glass substrate of barium borosilicate glass or alminoborosilicate glass or a synthesized quartz glass substrate. For example, 7059 glass or 1737 glass made by Corning Co. Ltd. can preferably be used.

A first undercoat insulating film 1002 is formed on the substrate 1001 by a silicon nitride film or a silicon oxynitride film (composition ratios Si=32%, O=27%, N=24%, H=17%) by publicly-known means (LPCVD process, plasma CVD process). According to the embodiment, the plasma CVD process is used and the silicon nitride film is formed by 50 nm.

A second undercoat insulating film 1003 having a refractive index different from that of the first undercoat insulating film 1002 is formed thereon by a silicon oxide film or a silicon oxynitride film by publicly-known means (LPCVD process, plasma CVD process). According to the embodiment, the plasma CVD process is used and the silicon oxynitride film (composition ratios Si=32%, O=59%, N=7%, H=2%) is formed by 130 through 150 nm.

Figure 4B:
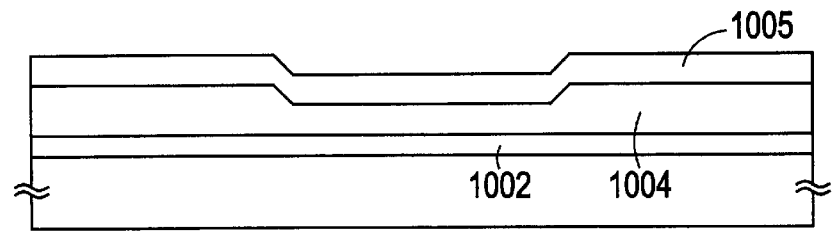

After forming the second undercoat insulating film 1003, a resist mask is formed by using the photolithography technology and unnecessary portions are etched to thereby provide a third undercoat insulating film 1004 having a portion having a film thickness of 130 through 150 nm and a portion having a film thickness of 78 through 98 nm (FIG. 4B). In etching, a dry etching process using a fluorine species gas may be used or a wet etching process using a fluorine species aqueous solution may be used. When the wet etching process is selected, etching may be carried out by, for example, a mixed solution including 7.13% of ammonium hydrogen fluoride ($NH_4HF_2$) and 15.4% of ammonium fluoride ($NH_4F$) (made by Stellachemifer Co. Ltd., commercial name LAL 500).

Figure 1A:
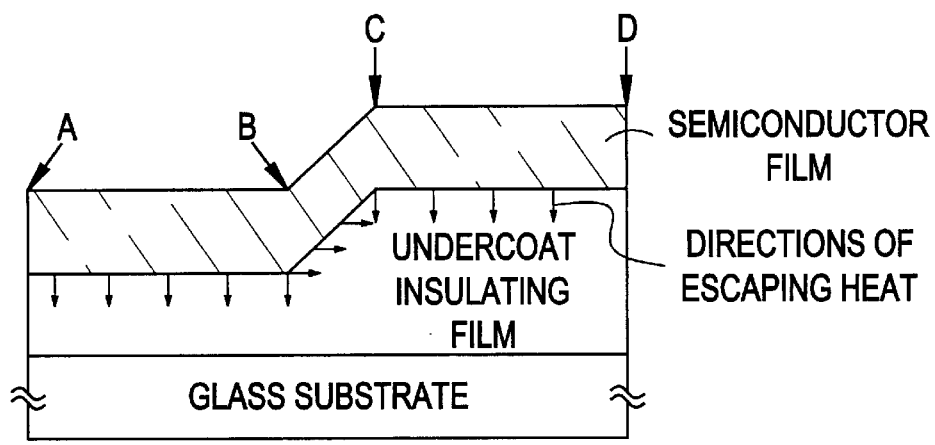
FIG. 1A is a view showing an example of the invention disclosed in Japanese Patent Application No. 351060/1999 by the inventors
Figure 1B:
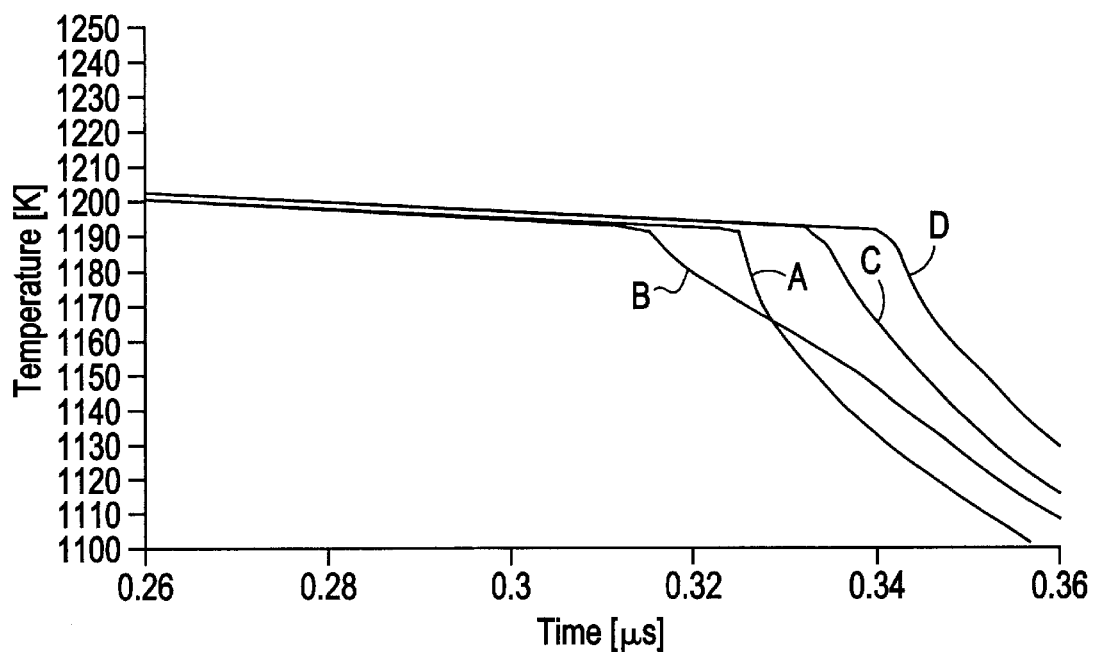
FIG. 1B is a diagram showing temperature history at respective point of FIG. 1A.
Figure 2A:
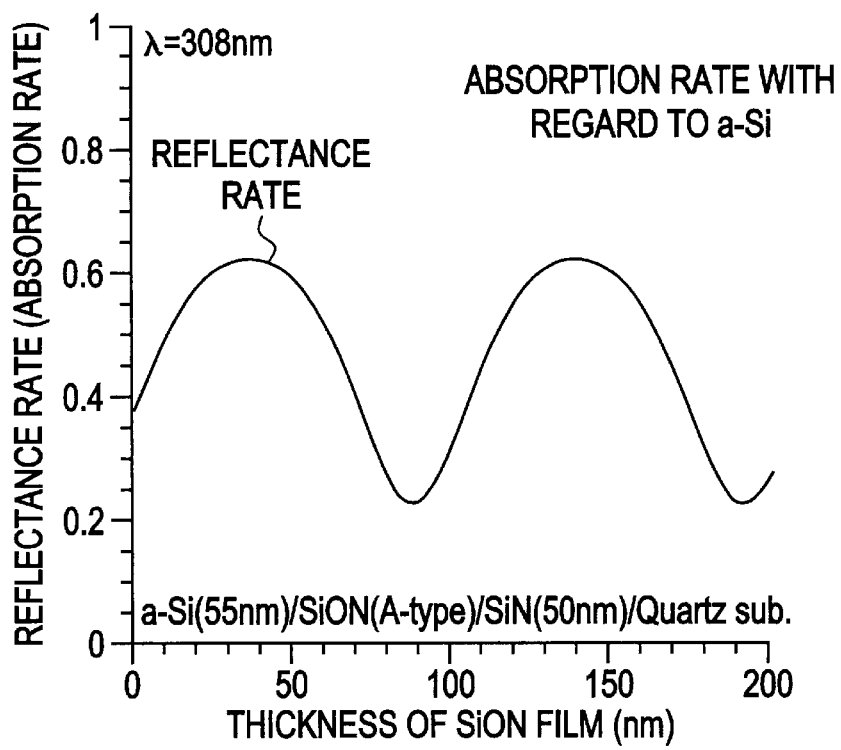
FIG. 2A is a diagram showing reflectance and absorption rate with regard to an amorphous silicon film when laser beam having a wavelength of 308 nm is irradiated from a rear face side of a substrate to a second sample, by fixing a film thickness of a silicon nitride film and changing a film thickness of a silicon oxynitride film (A-type)

The third undercoat insulating film 1004 is constituted by two stages of film thickness for forming an effective intensity distribution of laser beam with regard to a semiconductor film. In FIG. 2A, a film thickness in correspondence with a maximum value of about 62.5% of reflectance with regard to an amorphous silicon film which appears periodically, is 130 through 150 nm and a film thickness in correspondence with a minimum value of about 22.7% with regard to the amorphous silicon film, is 78 through 98 nm. As has already been described, the reflectance with regard to the amorphous silicon film is provided with periodicity and accordingly, the film thicknesses are not limited to the above-described film thicknesses so far as the film thicknesses are film thicknesses in correspondence with about the maximum value and about the minimum value of the reflectance with regard to the amorphous silicon film. However, it is preferable that a difference between two stages of the film thicknesses of the third undercoat insulating film 1004 is smaller than a film thickness of an amorphous semiconductor film formed thereafter. Further, it is preferable to etch the unnecessary portion in a taper shape such that an angle of a side wall at the stepped difference of the second undercoat insulating film 1004 becomes equal to or larger than 5 degree or less than 85 degree(preferably, 30 degree through 60 degree) relative to the substrate 1001 to thereby ensure step coverage of a film laminated thereon.

An amorphous semiconductor film 1005 shown in FIG. 4B is formed along the third undercoat insulating film 1004 having the stepped difference by a thickness of 25 through 200 nm (preferably, 30 through 100 nm) by a publicly-known process of plasma CVD process or sputtering process. According to the embodiment, the amorphous silicon film is formed by a film thickness of 55 nm. Incidentally, as the amorphous semiconductor film, there is an amorphous semiconductor film or a microcrystal semiconductor film and a compound semiconductor film having an amorphous structure such as an amorphous silicon germanium film may be applied thereto.

Figure 4C:
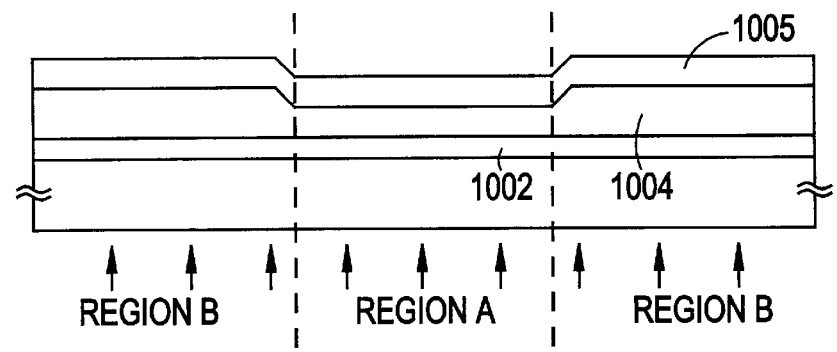
Figure 4D:
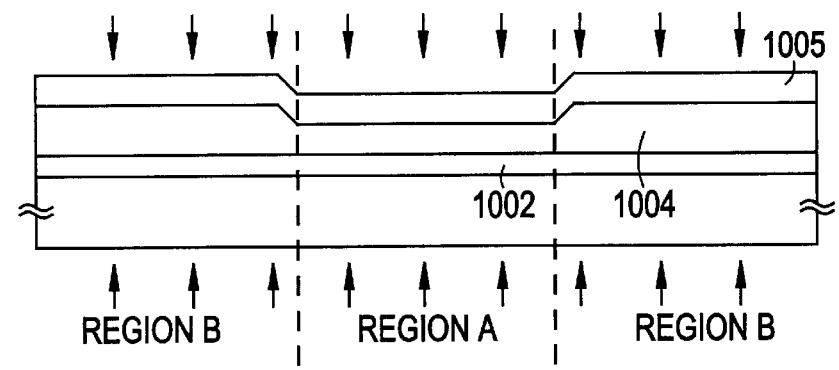

FIG. 4C is a view for explaining a crystallizing step of irradiating laser beam from a rear face side and FIG. 4D is a view for explaining a crystallizing step of irradiating laser beam from both sides of a surface side and the rear face side of the substrate. According to the invention, either of the methods is used. In crystallizing by a laser annealing process, it is preferable to firstly discharge hydrogen included in the amorphous semiconductor film and the included hydrogen amount may be made equal to or smaller than 5 atom % by exposing the amorphous semiconductor film in a nitrogen atmosphere at 400 through 500° C. for about 1 hour. Thereby, laser resistance of the film is remarkably promoted.

An explanation will be given of a laser oscillator used in the laser annealing process. Excimer laser is provided with large output and can currently oscillate highly repeated pulses of about 300 Hz and therefore, the excimer laser is frequently used. Further, not only pulse- oscillated excimer laser but also continuously-oscillated excimer laser, Ar laser, YAG laser, YVO$_4$ laser or YLF laser can be used.

The amorphous semiconductor film is crystallized by either of the irradiating processes of FIG. 4C and FIG. 4D by using any of the above-described laser oscillators. As has already been described, the film thickness of the third undercoat insulating film 1004 is of two stages and therefore, when laser beam is irradiated from the rear face side, reflectance of the laser beam with regard to the amorphous semiconductor film 1005 is about 22.7% at region A and about 62.5% at region B and effective intensities of laser beam therefor are different from each other.

Figure 4E:
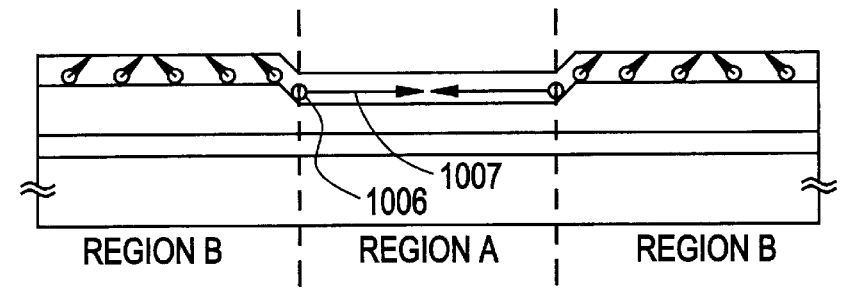

Further, at an end of the stepped difference at the third undercoat insulating film 1004 of FIG. 4C or FIG. 4D, as locations of escaping heat, there are two of (1)undercoat insulating film right thereunder and (2)undercoat insulating film present in the lateral direction and therefore, the end of the stepped difference is cooled more fastly than in other location. Therefore, solidification is started from the semiconductor film at above the end of the stepped difference in the second undercoat insulating film at which temperature is lowered initially and a crystal nucleus 1006 is generated. The crystal nucleus constitutes center of crystal growth and the crystal growth is progressed toward region A or region B in a molten state having high temperature. However, the absorption rate of the laser beam at region A is higher than that of region B and accordingly, the crystal nucleus is grown in a direction designated by numeral 1007 and accordingly, a crystal grain having a larger particle size is formed at the semiconductor film of region A. In this way, there can be formed a crystalline semiconductor film having crystal grains which are provided with large particle sizes and positions of which are controlled. (FIG. 4E)

After irradiating laser beam, remaining defects can be neutralized by subjecting the semiconductor film to a heating treatment at 300 through 450° C. in an atmosphere including 3 through 100% of hydrogen or a heating treatment at 200 through 450° C. in an atmosphere including hydrogen formed by plasma. By fabricating TFT with region A of the crystalline semiconductor film fabricated in this way as a channel forming region, electric properties of the TFT can be promoted.

Embodiment 2

An explanation will be given of the embodiment in reference to FIGS. 5A, 5B, 5C, 5D and 5E. In FIG. 5A, as a substrate 1001, there is used a nonalkaline glass substrate of barium borosilicate glass or alminoborosilicate glass or a synthesized quartz glass substrate. For example, 7059 glass or 1737 glass made by Corning Co. Ltd. can preferably be used.

A first undercoat insulating film 1009 is formed on the substrate 1001 by a silicon nitride film or a silicon oxynitride film (composition ratios Si=32%, O=27%, N=24%, H=17%) by publicly-known means (LPCVD process, plasma CVD process). According to the embodiment, the plasma CVD process is used and the silicon nitride film is formed by 55 through 85 nm.

After forming the first undercoat insulating film 1003, a resist mask is formed by using the photolithography technology and unnecessary portions are etched to thereby provide a second undercoat insulating film 1010 having a portion having a film thickness of 55 through 85 nm and a portion having a film thickness of 25 through 45 nm (FIG. 5B). In etching, a dry etching process using a fluorine species gas may be used or a wet etching process using a fluorine species aqueous solution may be used. When the wet etching process is selected, etching may be carried out by, for example, a mixed solution including 7.13% of ammonium hydrogen fluoride (NH$_4$HF$_2$) and 15.4% of ammonium fluoride (NH$_4$F) (made by Stellachemifer Co. Ltd., commercial name LAL 500).

A third undercoat insulating film 1011 having a refractive index different from that of the first undercoat insulating film 1010 is formed thereon by a silicon oxide film or a silicon oxynitride film by publicly-known means (LPCVD process, plasma CVD process). According to the embodiment, the plasma CVD process is used and the silicon oxynitride film (composition ratios Si=32%, O=59%, N=7%, H=2%) is formed by 100 nm.

Figure 2B:
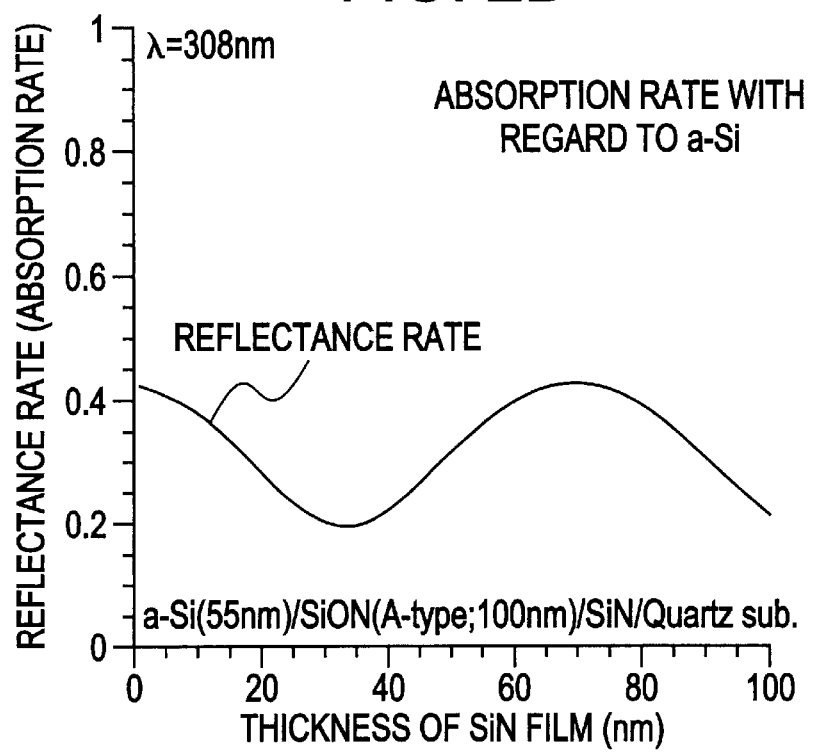
FIG. 2B is a diagram showing reflectance and absorption rate with regard to the amorphous silicon film when laser beam having a wavelength of 308 nm is irradiated from the rear face side of the substrate to the second sample, by fixing the film thickness of the silicon oxynitride film (A-type) and changing the film thickness of the silicon nitride film.
Figure 3A:
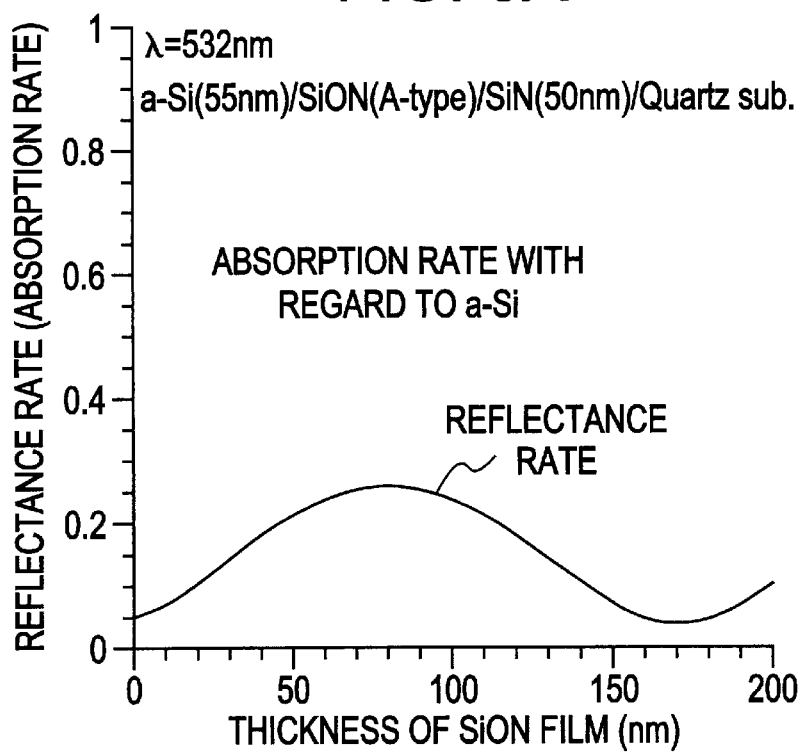
FIG. 3A is a diagram showing reflectance and absorption rate with regard to the amorphous silicon film when laser beam having a wavelength of 532 nm is irradiated from the rear face side of the substrate to the second sample by fixing the film thickness of the silicon nitride film and changing the film thickness of the silicon oxynitride film (A-type) and FIG. 3B is a diagram showing reflectance and absorption rate with regard to the amorphous silicon film when the laser beam having the wavelength of 532 nm is irradiated from the rear face side of the substrate to the second sample, by fixing the film thickness of the silicon oxynitride film (A-type) and changing the film thickness of the silicon nitride film.
Figure 3B:
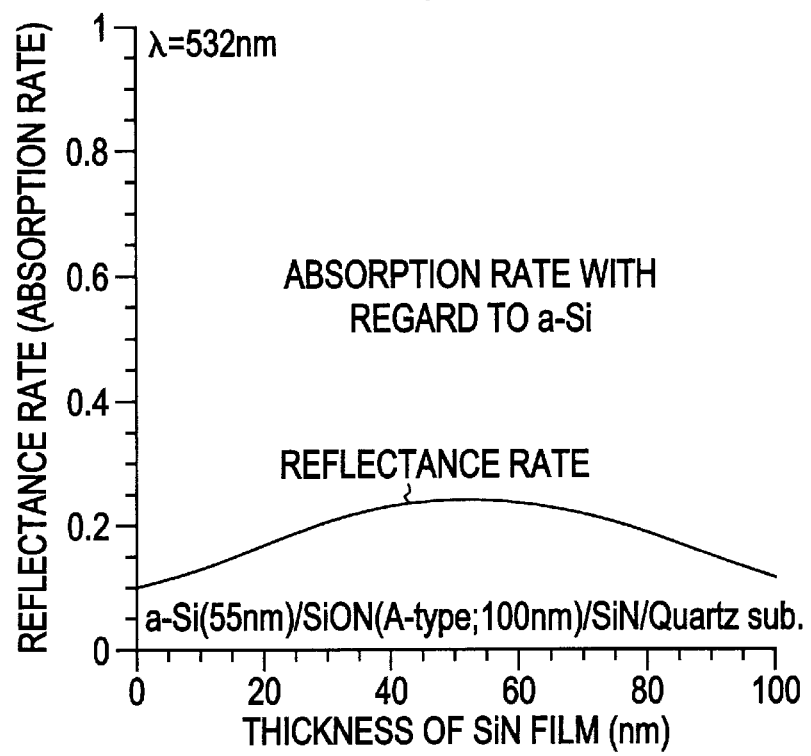

The second undercoat insulating film 1010 is constituted by two stages of film thickness for forming an effective intensity distribution of laser beam with regard to a semiconductor film. In FIG. 2B, a film thickness in correspondence with a maximum value of about 42.5% of reflectance with regard to an amorphous silicon film which appears periodically, is 55 through 85 nm and a film thickness in correspondence with a minimum value of about 20% with regard to the amorphous silicon film, is 25 through 45 nm. As has already been described, the reflectance with regard to the amorphous silicon film is provided with periodicity and accordingly, the film thicknesses are not limited to the above-described film thicknesses so far as the film thicknesses are film thicknesses in correspondence with about the maximum value and about the minimum value of the reflectance with regard to the amorphous silicon film. However, it is preferable that a difference between two stages of the film thicknesses of the second undercoat insulating film 1010 is smaller than a film thickness of an amorphous semiconductor film formed thereafter. Further, it is preferable to etch the unnecessary portion in a taper shape such that an angle of a side wall at the stepped difference of the second undercoat insulating film 1010 becomes equal to or larger than 5 degree or less than 85 degree (preferably, 30 degree through 60 degree) relative to the substrate 1001 to thereby ensure step coverage of a film laminated thereon.

An amorphous semiconductor film 1012 shown in FIG. 5B is formed along the third undercoat insulating film 1011 having the stepped difference by a thickness of 25 through 200 nm (preferably, 30 through 100 nm) by a publicly-known process of plasma CVD process or sputtering process. According to the embodiment, the amorphous silicon film is formed by a film thickness of 55 nm. Incidentally, as the amorphous semiconductor film, there is an amorphous semiconductor film or a microcrystal semiconductor film and a compound semiconductor film having an amorphous structure such as an amorphous silicon germanium film may be applied thereto.

FIG. 5C is a view for explaining a crystallizing step of irradiating laser beam from a rear face side and FIG. 5D is a view for explaining a crystallizing step of irradiating laser beam from both sides of a surface side and the rear face side of the substrate. According to the invention, either of the methods is used. In crystallizing by a laser annealing process, it is preferable to firstly discharge hydrogen included in the amorphous semiconductor film and the included hydrogen amount may be made equal to or smaller than 5 atom % by exposing the amorphous semiconductor film in a nitrogen atmosphere at 400 through 500° C. for about 1 hour. Thereby, laser resistance of the film is remarkably promoted.

An explanation will be given of a laser oscillator used in the laser annealing process. Excimer laser is provided with large output and can currently oscillate highly repeated pulses of about 300 Hz and therefore, the excimer laser is frequently used. Further, not only pulse- oscillated excimer laser but also continuously-oscillated excimer laser, Ar laser, YAG laser, YVO$_4$ laser or YLF laser can be used.

The amorphous semiconductor film is crystallized by either of the irradiating processes of FIG. 5C and FIG. 5D by using any of the above-described laser oscillators. As has already been described, the film thickness of the second undercoat insulating film 1010 is of two stages and therefore, when laser beam is irradiated from the rear face side, the reflectance of the laser beam with regard to the amorphous semiconductor film 1012 is about 20% at region A and about 42.5% at region B and effective intensities of laser beam therefor are different from each other.

Further, at an end of the stepped difference at the second undercoat insulating film 1010 of FIG. 5C or FIG. 5D, as locations of escaping heat, there are two of (1)undercoat insulating film right thereunder and (2)undercoat insulating film present in the lateral direction and therefore, the end of the stepped difference is cooled more fastly than in other location. Therefore, solidification is started from the semiconductor film at above the end of the stepped difference in the second undercoat insulating film at which temperature is lowered initially and a crystal nucleus 1006 is generated. The crystal nucleus constitutes center of crystal growth and the crystal growth is progressed toward region A or region B in a molten state having high temperature. However, the absorption rate of the laser beam at region A is higher than that of region B and accordingly, the crystal nucleus is grown in a direction designated by numeral 1007 and accordingly, a crystal grain having a larger particle size is formed at the semiconductor film of region A. In this way, there can be formed a crystalline semiconductor film having crystal grains which are provided with large particle sizes and positions of which are controlled. (FIG. 5E)

After irradiating laser beam, remaining defects can be neutralized by subjecting the amorphous semiconductor film to a heating treatment at 300 through 450° C. in an atmosphere including 3 through 100% of hydrogen or a heating treatment at 200 through 450° C. in an atmosphere including hydrogen formed by plasma. By fabricating TFT with region A of the crystalline semiconductor film fabricated in this way as a channel forming region, electric properties of the TFT can be promoted.

Embodiment 3

Figure 6A:
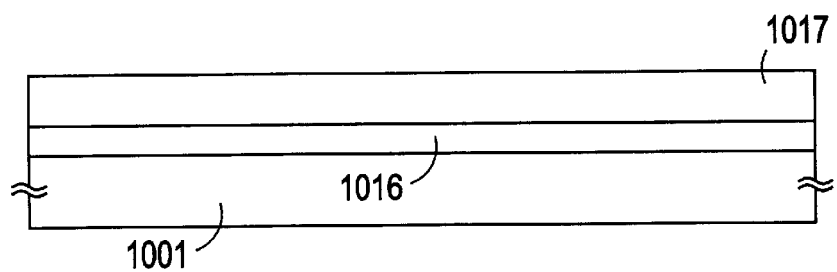
FIGS. 6A, 6B, 6C, 6D and 6E are views showing an example of forming an undercoat film and irradiating laser beam disclosed in the invention.

An explanation will be given of the embodiment in reference to FIGS. 6A, 6B, 6C, 6D and 6E. In FIG. 6A, as a substrate 1001, there is used a nonalkaline glass substrate of barium borosilicate glass or alminoborosilicate glass or a synthesized quartz glass substrate. For example, 7059 glass or 1737 glass made by Corning Co. Ltd. can preferably be used.

A first undercoat insulating film 1016 is formed on the substrate 1001 by a silicon nitride film or a silicon oxynitride film (composition ratios Si=32%, O=27%, N=24%, H=17%) by publicly-known means (LPCVD process, plasma CVD process). According to the embodiment, the plasma CVD process is used and the silicon nitride film is formed by 78 through 98 nm.

A second undercoat insulating film 1017 having a refractive index different from that of the first undercoat insulating film 1016 is formed thereon by a silicon oxide film or a silicon oxynitride film by publicly-known means (LPCVD process, plasma CVD process). According to the embodiment, the plasma CVD process is used and the silicon oxynitride film (composition ratios Si=32%, O=59%, N=7%, H=2%) is formed by 130 through 150 nm.

Figure 6B:
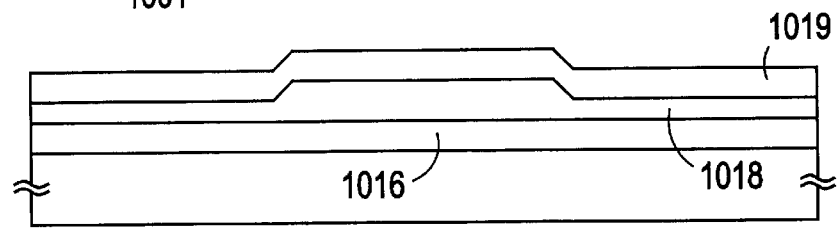

After forming the second undercoat insulating film 1017, a resist mask is formed by using the photolithography technology and unnecessary portions are etched to thereby provide a third undercoat insulating film 1018 having a portion having a film thickness of 25 through 45 nm and a portion having a film thickness of 78 through 98 nm (FIG. 6B). In etching, a dry etching process using a fluorine species gas may be used or a wet etching process using a fluorine species aqueous solution may be used. When the wet etching process is selected, etching may be carried out by, for example, a mixed solution including 7.13% of ammonium hydrogen fluoride (NH$_4$HF$_2$) and 15.4% of ammonium fluoride (NH$_4$F) (made by Stellachemifer Co. Ltd., commercial name LAL 500).

The third undercoat insulating film 1018 is constituted by two stages of film thickness for forming an effective intensity distribution of laser beam with regard to a semiconductor film. In FIG. 2A, a film thickness in correspondence with a maximum value of about 62.5% of reflectance with regard to an amorphous silicon film which appears periodically, is 25 through 45 nm and a film thickness in correspondence with a minimum value of about 22.7% with regard to the amorphous silicon film, is 78 through 98 nm. As has already been described, the reflectance with regard to the amorphous silicon film is provided with periodicity and accordingly, the film thicknesses are not limited to the above-described film thicknesses so far as the film thicknesses are film thicknesses in correspondence with about the maximum value and about the minimum value of the reflectance with regard to the amorphous silicon film. However, it is preferable that a difference between two stages of the film thicknesses of the third undercoat insulating film 1018 is smaller than a film thickness of an amorphous semiconductor film formed thereafter. Further, it is preferable to etch the unnecessary portion in a taper shape such that an angle of a side wall at the stepped difference of the third undercoat insulating film 1018 becomes equal to or larger than 5 degree or less than 85 degree (preferably, 30 degree through 60 degree) relative to the substrate 1001 to thereby ensure step coverage of a film laminated thereon.

An amorphous semiconductor film 1019 shown in FIG. 6B is formed along the third undercoat insulating film 1018 having the stepped difference by a thickness of 25 through 200 nm (preferably, 30 through 100 nm) by a publicly-known process of plasma CVD process or sputtering process. According to the embodiment, the amorphous silicon film is formed by a film thickness of 55 nm. Incidentally, as the amorphous semiconductor film, there is an amorphous semiconductor film or a microcrystal semiconductor film and a compound semiconductor film having an amorphous structure such as an amorphous silicon germanium film may be applied thereto.

Figure 6C:
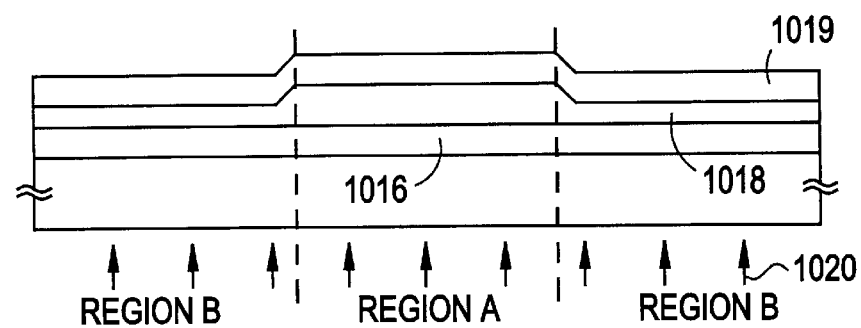
Figure 6D:
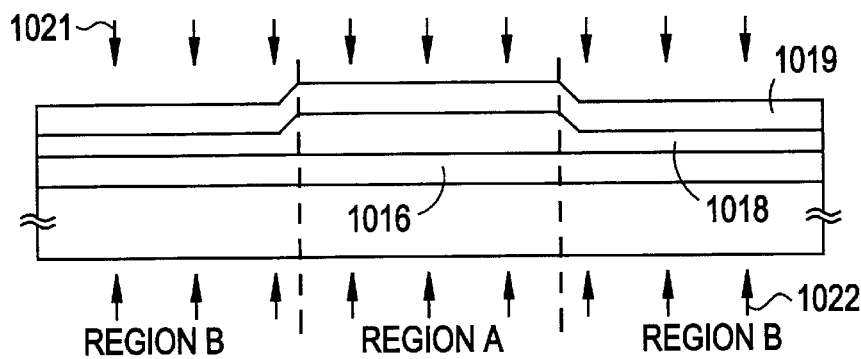

FIG. 6C is a view for explaining a crystallizing step of irradiating laser beam from a rear face side and FIG. 6D is a view for explaining a crystallizing step of irradiating laser beam from both sides of a surface side and the rear face side of the substrate. According to the invention, either of the methods is used. In crystallizing by a laser annealing process it is preferable to firstly discharge hydrogen included in the amorphous semiconductor film and the included hydrogen amount may be made equal to or smaller than 5 atom % by exposing the amorphous semiconductor film in a nitrogen atmosphere at 400 through 500° C. for about 1 hour. Thereby, laser resistance of the film is remarkably promoted.

An explanation will be given of a laser oscillator used in the laser annealing process. Excimer laser is provided with large output and can currently oscillate highly repeated pulses of about 300 Hz and therefore, the excimer laser is frequently used. Further, not only pulse-oscillated excimer laser but also continuously-oscillated excimer laser, Ar laser, YAG laser, $YVO_4$ laser or YLF laser can be used.

The amorphous semiconductor film is crystallized by either of the irradiating processes of FIG. 6C or FIG. 6D by using any of the above-described laser oscillators. As has already been described, the film thickness of the third undercoat insulating film 1018 is of two stages and therefore, when laser beam is irradiated from the rear face side, reflectance of the laser beam with regard to the amorphous semiconductor film 1019 is about 22.7% at region A and about 62.5% at region B and effective intensities of laser beam therefor are different from each other.

Figure 6E:
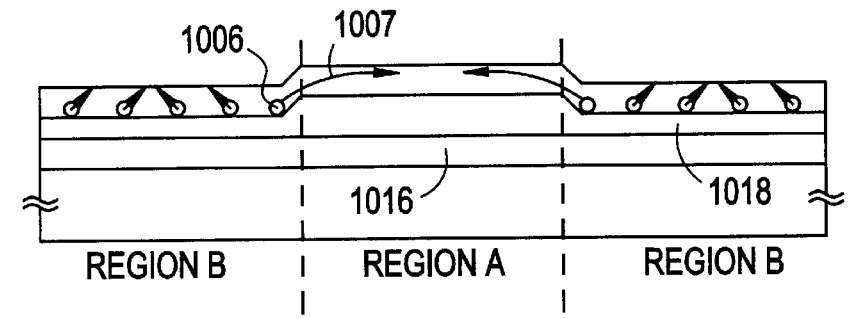

Further, at an end of the stepped difference at the third undercoat insulating film 1018 of FIG. 6C or FIG. 6D, as locations of escaping heat, there are two of (1) undercoat insulating film right thereunder and (2)undercoat insulating film present in the lateral direction and therefore, the end of the stepped difference is cooled more fastly than in other location. Therefore, solidification is started from the semiconductor film at above the end of the stepped difference in the third undercoat insulating film at which temperature is lowered initially and a crystal nucleus 1006 is generated. The crystal nucleus constitutes center of crystal growth and the crystal growth is progressed toward region A or region B in a molten state having high temperature. However, the absorption rate of the laser beam at region A is higher than that of region B and accordingly, the crystal nucleus is grown in a direction designated by numeral 1007 and accordingly, a crystal grain having a larger particle size is formed at the semiconductor film of region A. In this way, there can be formed a crystalline semiconductor film having crystal grains which are provided with large particle sizes and positions of which are controlled. (FIG. 6E)

After irradiating laser beam, remaining defects can be neutralized by subjecting the amorphous semiconductor film to a heating treatment at 300 through 450° C. in an atmosphere including 3 through 100% of hydrogen or a heating treatment at 200 through 450° C. in an atmosphere including hydrogen formed by plasma. By fabricating TFT with region A of the crystalline semiconductor film fabricated in this way as a channel forming region, electric properties of the TFT can be promoted.

EXAMPLES

Example 1

Here, an explanation will be given of a result of a simulation according to the invention in reference to FIGS. 7A through 8.

Figure 7A:
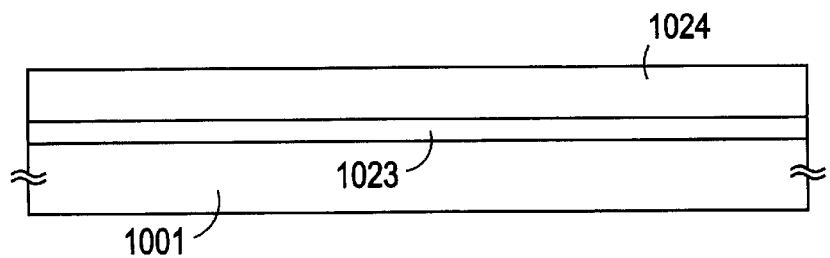
FIGS. 7A, 7B, 7C and 7D are views showing an example of forming an undercoat film and irradiating laser beam disclosed in the invention.

In FIG. 7A, as a substrate 1001, there is used nonalkaline glass substrate of barium borosilicate glass or alminoborosilicate glass or synthesized quartz glass substrate. According to the example, a synthesized quartz glass substrate is used.

A first undercoat insulating film 1023 is formed above the substrate 1001 by a silicon nitride film or a silicon oxynitride film by publicly-known means (LPCVD process, plasma CVD process). In this example, a plasma CVD process is used and a silicon nitride film is formed by 50 nm.

A second undercoat insulating film 1024 having a refractive index different from that of the first undercoat insulating film, is formed above the first undercoat insulating film 1023 by a silicon oxynitride film by publicly-known means (LPCVD process or plasma CVD process). In this example, a plasma CVD process is used and a silicon oxynitride film (composition ratios Si=32%, O=59%, N=7%, H=2%) is formed by 140 nm.

Figure 7B:
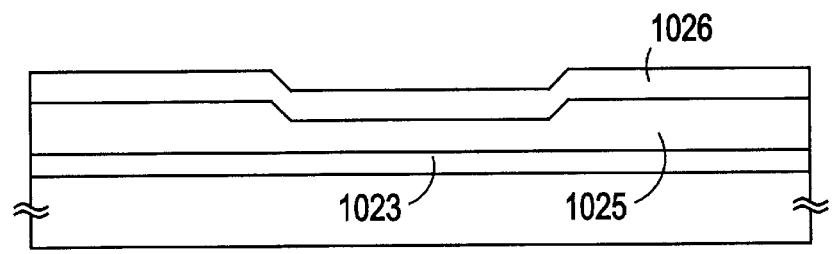

After forming the second undercoat insulating film 1024, a resist mask is formed by using the photolithography technology and unnecessary portions are etched to thereby provide a third undercoat insulating film 1025 having a portion having a film thickness of 140 nm and a portion having a film thickness of 88 nm (FIG. 7B). In etching, a dry etching process using a fluorine species gas may be used or a wet etching process using a fluorine species aqueous solution may be used. When the wet etching process is selected, etching may be carried out by, for example, a mixed solution including 7.13% of ammonium hydrogen fluoride ($NH_4HF_2$) and 15.4% of ammonium fluoride ($NH_4F$) (made by Stellachemifer Co. Ltd., commercial name LAL 500).

The third undercoat insulating film 1025 is constituted by two stages of film thickness for forming an effective intensity distribution of laser beam with regard to a semiconductor film. In FIG. 2A, a film thickness in correspondence with a maximum value of about 62.5% of reflectance with regard to an amorphous silicon film which appears periodically, is 140 nm and a film thickness in correspondence with a minimum value of about 22.7% with regard to the amorphous silicon film, is 88 nm. As has already been described, the reflectance with regard to the amorphous silicon film is provided with periodicity and accordingly, the film thicknesses are not limited to the above-described film thicknesses so far as the film thicknesses are film thicknesses in correspondence with about the maximum value and about the minimum value of the reflectance with regard to the amorphous silicon film. However, it is preferable that a difference between two stages of the film thicknesses of the third undercoat insulating film 1025 is smaller than a film thickness of an amorphous semiconductor film formed thereafter. Further, it is preferable to etch the unnecessary portion in a taper shape such that an angle of a side wall at the stepped difference of the second undercoat insulating film 1025 becomes equal to or larger than 5 degree or less than 85 degree (preferably, 30 degree through 60 degree) relative to the substrate 1001 to thereby ensure step coverage of a film laminated thereon.

An amorphous semiconductor film 1026 shown in FIG. 7B is formed along the third undercoat insulating film 1025 having the stepped difference by a thickness of 25 through 200 nm (preferably, 30 through 100 nm) by a publicly-known process of plasma CVD process or sputtering process. In this example, the amorphous silicon film is formed by a film thickness of 50 nm by using a plasma CVD process. Incidentally, as the amorphous semiconductor film, there is a noncrystalline semiconductor film or a microcrystal semiconductor film and a compound semiconductor film having an amorphous structure such as an amorphous silicon germanium film may be applied thereto.

Figure 7C:
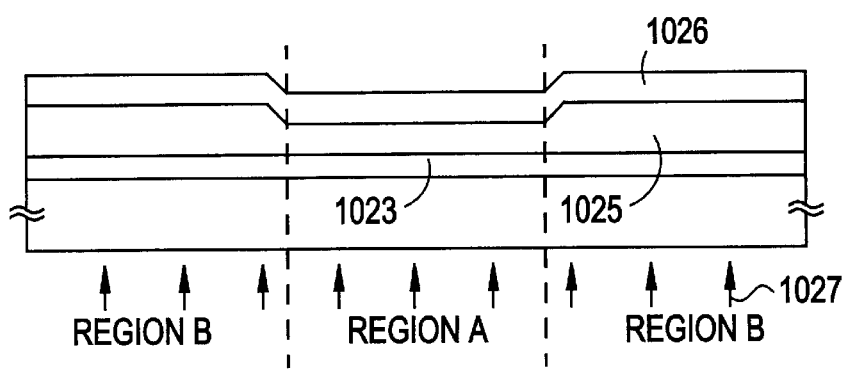
Figure 7D:
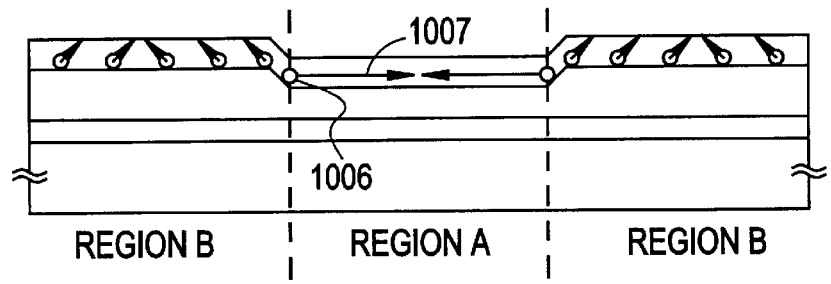

FIG. 7C is a view for explaining a crystallizing step of irradiating laser beam from a rear face side. According to the invention, there is used either of methods of irradiating laser beam from the rear face side of the substrate and irradiating laser beam from both sides of a surface side and the rear face side of the substrate, and in this example, laser beam is irradiated from the rear face side of the substrate. According to a crystallizing step by a laser annealing process, it is preferable to firstly discharge hydrogen included in the amorphous semiconductor film and the amorphous semiconductor film may be exposed in a nitrogen atmosphere at 400 through 500° C. for 1 hour to thereby make an amount of included hydrogen equal to or smaller than 5 atom %. Thereby, laser resistance of the film is remarkably promoted.

An explanation will be given of a laser oscillator used in the laser annealing process. Excimer laser is provided with large output and can currently oscillate highly repeated pulses of about 300 Hz and therefore, the excimer laser is frequently used. Further, not only pulse-oscillated excimer laser but also continuously-oscillated excimer laser, Ar laser, YAG laser, $YVO_4$ laser or YLF laser can be used.

In this example, the amorphous silicon film is crystallized by the irradiation method of FIG. 7C by using excimer laser (wavelength: 308 nm, pulse width: 30 ns). As has already been described, the film thickness of the third undercoat insulating film 1025 is constituted by two stages and therefore, when laser beam is irradiated from the rear face side, reflectance of the laser beam with regard to the amorphous silicon film is about 22.7% in region A and about 62.5% in region B and effective intensity of laser beam differs therebetween.

Further, at an end of the stepped difference at the third undercoat insulating film 1025 of FIG. 7C, as locations of escaping heat, there are two of (1)undercoat insulating film right thereunder and (2)undercoat insulating film present in the lateral direction and therefore, the end of the stepped difference is cooled more fastly than in other location. Therefore, solidification is started from the semiconductor film at above the end of the stepped difference in the third undercoat insulating film 1025 at which temperature is lowered initially and a crystal nucleus 1006 is generated. The crystal nucleus constitutes center of crystal growth and the crystal growth is progressed toward region A or region B in a molten state having high temperature. However, the absorption rate of the laser beam at region A is higher than that of region B and accordingly, the crystal nucleus is grown in a direction designated by numeral 1007 and accordingly, a crystal grain having a larger particle size is formed at the semiconductor film of region A. In this way, there can be formed a crystalline semiconductor film having crystal grains which are provided with large particle sizes and positions of which are controlled.

Figure 8:
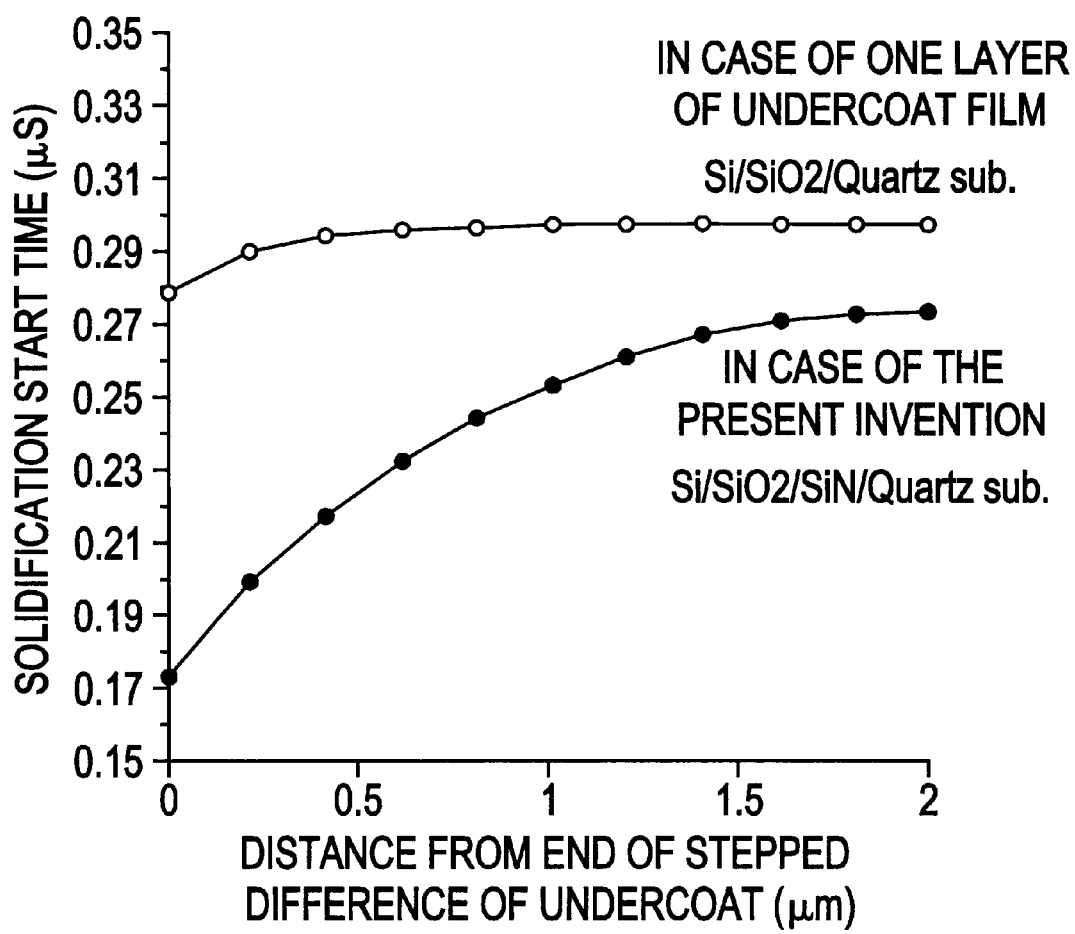
FIG. 8 is a diagram showing a comparison in time of starting to crystallize a solid phase between a constitution disclosed by the invention and an example of invention disclosed in Japanese Patent Application No. 351060/1999.

For the purpose of comparison, there is shown, in FIG. 8, a comparison of solidification start time by carrying out a simulation with regard to a sample formed with a silicon oxynitride film (A-type) above a synthesized quartz glass substrate and formed with an amorphous silicon film having a film thickness of 55 nm above the silicon oxynitride film (A-type). Incidentally, with regard to a film thickness of the silicon oxynitride film (A-type), there are provided two stages of film thickness of 88 nm and 140 nm as has already been shown in the example. FIG. 8 shows a relationship between a distance from an end of a stepped difference of the undercoat (boundary between region A and region B of FIG. 7C) and solidification start time. It is known from FIG. 8 that even when the undercoat film having the stepped difference is used, solidification of the semiconductor film after irradiating laser beam in crystallizing the semiconductor film having the constitution of the invention, is progressed more slowly than that in the case of a single layer of the undercoat film and therefore, there can be provided crystal grains having large particle sizes.

After irradiating laser beam, remaining defects can be neutralized by subjecting the amorphous semiconductor film to a heating treatment at 300 through 400° C. in an atmosphere including 3 through 100% of hydrogen or a heating treatment at 200 through 450° C. in an atmosphere including hydrogen formed by plasma. By fabricating TFT with region A of the crystalline semiconductor film fabricated in this way as a channel forming region, electric properties of the TFT can be promoted.

Example 2

Here, an explanation will be given of a method of carrying out laser annealing after partially crystallizing an amorphous silicon film by a heat treatment by using the constitution of the invention.

Figure 9A:
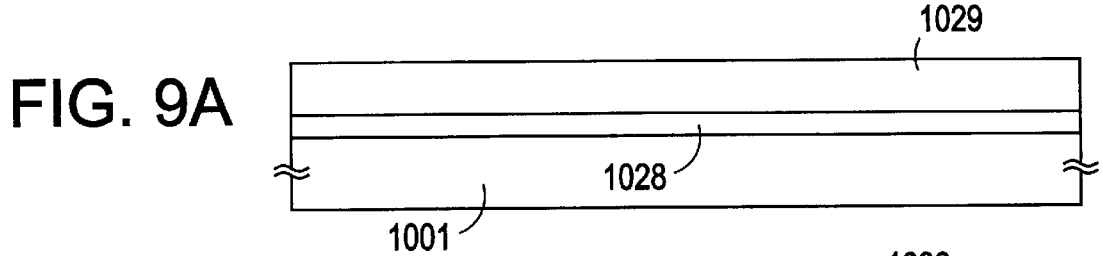
FIGS. 9A, 9B, 9C, 9D and 9E are views showing an example of forming an under coat film and irradiating laser beam disclosed in the invention.

In FIG. 9A, as a substrate 1001, there is used nonalkaline glass substrate of barium borosilicate glass or alminoborosilicate glass or synthesized quartz glass substrate. According to the example, a synthesized quartz glass substrate is used.

A first undercoat insulating film 1028 is formed above the substrate 1001 by a silicon nitride film or a silicon oxynitride film by publicly-known means (LPCVD process or plasma CVD process). In this example, a plasma CVD process is used and a silicon nitride film is formed by 50 nm.

A second undercoat insulating film 1029 having a refractive index different from that of the first undercoat insulating film 1028 is formed thereon by a silicon oxide film or a silicon oxynitride film by publicly-known means (LPCVD process, plasma CVD process). According to the embodiment, the plasma CVD process is used and the silicon oxynitride film (composition ratios Si=32%, O=59%, N=7%, H=2%) by 140 nm.

Figure 9B:
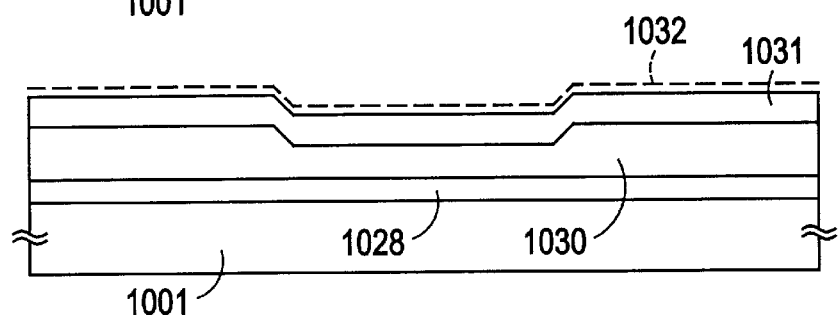

After forming the second undercoat insulating film 1029, a resist mask is formed by using the photolithography technology and unnecessary portions are etched to thereby provide a third undercoat insulating film 1030 having a portion having a film thickness of 140 nm and a portion having a film thickness of 88 nm (FIG. 9B). In etching, a dry etching process using a fluorine species gas may be used or a wet etching process using a fluorine species aqueous solution may be used. When the wet etching process is selected, etching may be carried out by, for example, a mixed solution including 7.13% of ammonium hydrogen fluoride ($NH_4HF_2$) and 15.4% of ammonium fluoride ($NH_4F$) (made by Stellachemifer Co. Ltd., commercial name LAL 500).

The third undercoat insulating film 1030 is constituted by two stages of film thickness for forming an effective intensity distribution of laser beam with regard to a semiconductor film. In FIG. 2A, a film thickness in correspondence with a maximum value of about 62.5% of reflectance with regard to an amorphous silicon film which appears periodically, is 140 nm and a film thickness in correspondence with a minimum value of about 22.7% with regard to the amorphous silicon film, is 88 nm. As has already been described, the reflectance with regard to the amorphous silicon film is provided with periodicity and accordingly, the film thicknesses are not limited to the above-described film thicknesses so far as the film thicknesses are film thicknesses in correspondence with about the maximum value and about the minimum value of the reflectance with regard to the amorphous silicon film. However, it is preferable that a difference between two stages of the film thicknesses of the third undercoat insulating film 1030 is smaller than a film thickness of an amorphous semiconductor film formed thereafter. Further, it is preferable to etch the unnecessary portion in a taper shape such that an angle of a side wall at the stepped difference of the third undercoat insulating film 1030 becomes equal to or larger than 5 degree or less than 85 degree (preferably, 30 degree through 60 degree) relative to the substrate 1001 to thereby ensure step coverage of a film laminated thereon.

An amorphous semiconductor film 1031 shown in FIG. 9B is formed along the third undercoat insulating film 1030 having the stepped difference by a thickness of 25 through 200 nm (preferably, 30 through 100 nm) by a publicly-known process of plasma CVD process or sputtering process. In this example, the amorphous silicon film is formed by 50 nm by using a plasma CVD process. Incidentally, as the amorphous semiconductor film, there is a noncrystalline semiconductor film or a microcrystal semiconductor film and a compound semiconductor film having an amorphous structure such as an amorphous silicon germanium film may be applied thereto.

Figure 9C:
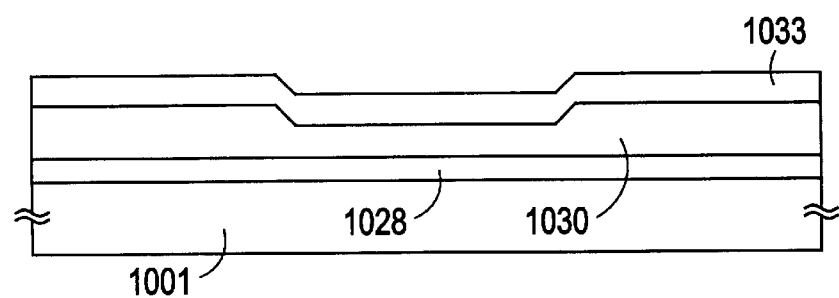

Next, the amorphous silicon film is partially crystallized by a method described in Japanese Patent Publication No. 183540/1995. Here, a simple explanation will be given of the method. First, an element of nickel, palladium or lead is added to the amorphous semiconductor film by a small amount. As the method of adding thereof, there may be utilized a plasma processing process, a vapor deposition process, an ion implantation process, a sputtering process or a solvent coating process. After adding the element, when the amorphous semiconductor film is placed in, for example, a nitrogen atmosphere at 550° C. for 4 hours, there is provided a crystalline semiconductor film having excellent electric properties. Heating temperature and heating time period optimum for the crystallization, depend on an amount of adding the element and a state of the amorphous semiconductor film. For example, when the solvent coating process is applied and a nickel acetate solution is used as solution, a metal including layer 1032 is formed by coating the nickel acetate solution having a weight equivalent concentration of 10 ppm by 5 ml over an entire face of the film by a spin coating process. (FIG. 9B) Next, the substrate is heated in a nitrogen atmosphere at temperature of 500° C. for 1 hour and further continuously, in a nitrogen atmosphere at temperature of 550° C. to thereby provide a first crystalline silicon film 1033 which is partially crystallized. (FIG. 9C)

Figure 9D:
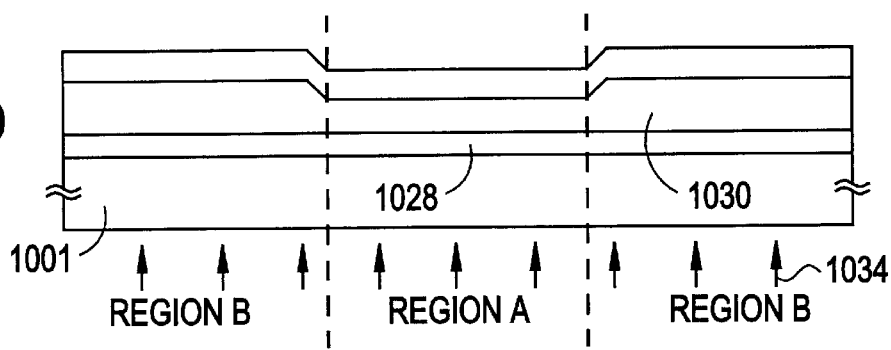
Figure 9E:
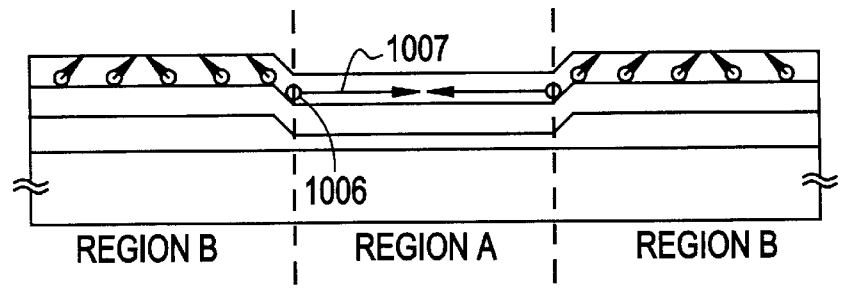
Figure 10A:
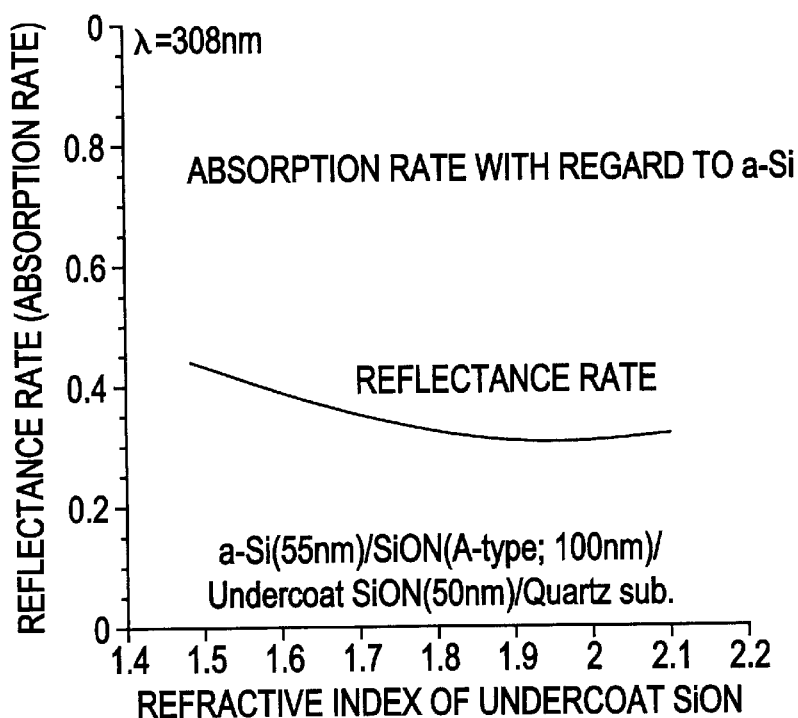
FIG. 10A is a diagram showing reflectance and absorption rate with regard to an amorphous film when laser beam having a wavelength of 308 nm is irradiated from a rear face side of a substrate to a third sample, by changing refractive index of a lower layer silicon oxynitride film
Figure 10B:
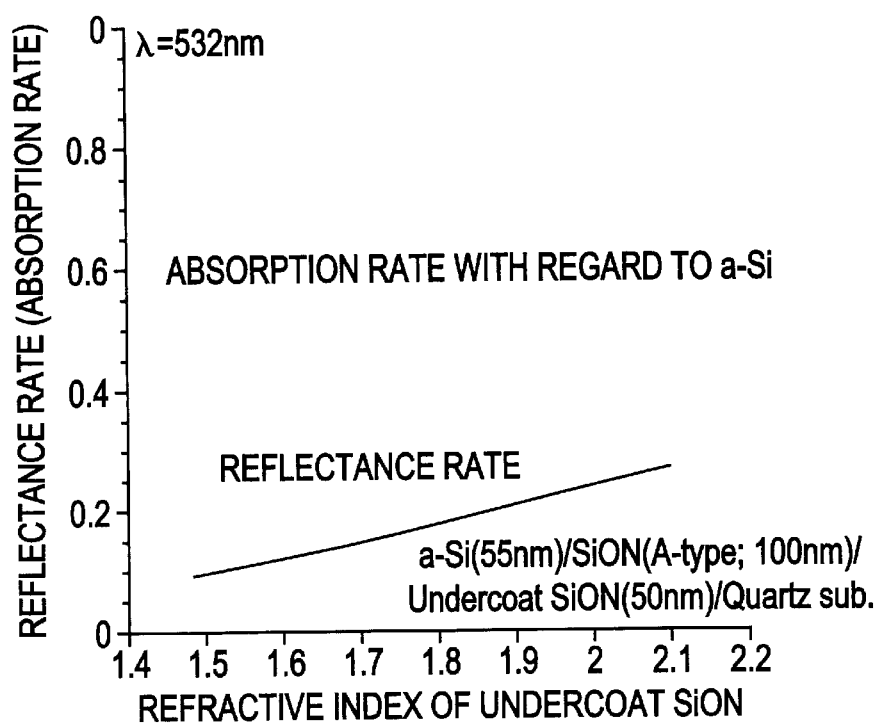
FIG. 10B is a diagram showing reflectance and absorption rate with regard to the amorphous silicon film when laser beam having a wavelength of 532 nm is irradiated from the rear face side of the substrate to the third sample, by changing the refractive index of the lower layer silicon oxynitride film.

FIG. 9D is a view for explaining a crystallizing step of irradiating laser beam from a rear face side. According to the invention, there is used either of methods of irradiating laser beam from the rear face side of the substrate and irradiating laser beam from both sides of a surface side and the rear face side of the substrate, and in this example, laser beam is irradiated from the rear face side of the substrate. According to a crystallizing step by a laser annealing process, it is preferable to firstly discharge hydrogen included in the amorphous semiconductor film and the amorphous semiconductor film may be exposed in a nitrogen atmosphere at 400 through 500° C. for 1 hour to thereby make an amount of included hydrogen equal to or smaller than 5 atom %. Thereby, laser resistance of the film is remarkably promoted.

An explanation will be given of a laser oscillator used in the laser annealing process. Excimer laser is provided with large output and can currently oscillate highly repeated pulses of about 300 Hz and therefore, the excimer laser is frequently used. Further, not only pulse-oscillated excimer laser but also continuously-oscillated excimer laser, Ar laser, YAG laser, $YVO_4$ laser or YLF laser can be used.

In this example, the amorphous silicon film is crystallized by the irradiation method of FIG. 9D by using excimer laser (wavelength: 308 nm, pulse width: 30 ns). As has already been described, the film thickness of the third undercoat insulating film 1030 is constituted by two stages and therefore, when laser beam is irradiated from the rear face side, reflectance of the laser beam with regard to the amorphous silicon film is about 22.7% in region A and about 62.5% in region B and effective intensity of laser beam with regard to the first crystalline silicon film 1033 differs therebetween.

Further, at an end of the stepped difference at the third undercoat insulating film 1030 of FIG. 9D, as locations of escaping heat, there are two of (1)undercoat insulating film right thereunder and (2)undercoat insulating film present in the lateral direction and therefore, the end of the stepped difference is cooled more fastly than in other location. Therefore, solidification is started from the semiconductor film at above the end of the stepped difference in the third undercoat insulating film 1030 at which temperature is lowered initially and a crystal nucleus 1006 is generated. The crystal nucleus constitutes center of crystal growth and the crystal growth is progressed toward region A or region B in a molten state having high temperature. However, the absorption rate of the laser beam at region A is higher than that of region B and accordingly, the crystal nucleus is grown in a direction designated by numeral 1007 and accordingly, a crystal grain having a larger particle size is formed at the semiconductor film of region A. In this way, there can be formed a crystalline semiconductor film having crystal grains which are provided with large particle sizes and positions of which are controlled.

After irradiating laser beam, remaining defects can be neutralized by subjecting the amorphous semiconductor film to a heating treatment at 300 through 450° C. in an atmosphere including 3 through 100% of hydrogen or a heating treatment at 200 through 450° C. in an atmosphere including hydrogen formed by plasma. By fabricating TFT with region A of the crystalline semiconductor film fabricated in this way as a channel forming region, electric properties of the TFT can be promoted.

Example 3

Here, a detailed explanation will be given of a method of simultaneously forming a pixel portion and TFTs (n-channel type TFT and p-channel type TFT) provided at a periphery of the pixel portion on the same substrate in reference to FIG. 11A through FIG. 13C.

In FIG. 11A, as a substrate 1001, there is used a nonalkaline glass substrate of barium borosilicate glass or aliminoborosilicate glass or a synthesized quartz glass substrate. In this example, a synthesized quartz glass substrate is used.

A first undercoat insulating film 100*a* is formed above the substrate 1001 by a silicon nitride film or a silicon oxynitride film by publicly-known means (LPCVD process, plasma CVD process). In this example, a plasma CVD process is used and a silicon nitride film is formed by 50 nm.

A second undercoat insulating film 100*b* having a refractive index different from that of the first undercoat insulating film is formed thereon by a silicon oxynitride film by publicly-known means (LPCVD process, plasma CVD process). In this example, a plasma CVD process is used and a silicon oxynitride film (composition ratios Si=32%, O=59%, N=7%, H=2%) is formed by 140 nm.

After forming the second undercoat insulating film, a resist mask is formed by using the photolithography technology and unnecessary portions are etched to thereby provide a third insulating film 100*c* having a portion having a film thickness of 140 nm and a portion having a film thickness of 88 nm (FIG. 11B). In etching, a dry etching process using a fluorine species gas may be used or a wet etching process using a fluorine species aqueous solution may be used. When the wet etching process is selected, etching may be carried out by, for example, a mixed solution including 7.13% of ammonium hydrogen fluoride ($NH_4HF_2$) and 15.4% of ammonium fluoride ($NH_4F$) (made by Stellachemifer Co. Ltd., commercial name LAL 500).

The third undercoat insulating film 100*c* is constituted by two stages of film thickness for forming an effective intensity distribution of laser beam with regard to a semiconductor film. In FIG. 2A, a film thickness in correspondence with a maximum value of about 62.5% of reflectance with regard to an amorphous silicon film which appears periodically, is 140 nm and a film thickness in correspondence with a minimum value of about 22.7% with regard to the amorphous silicon film, is 88 nm. As has already been described, the reflectance with regard to the amorphous silicon film is provided with periodicity and accordingly, the film thicknesses are not limited to the above-described film thicknesses so far as the film thicknesses are film thicknesses in correspondence with about the maximum value and about the minimum value of the reflectance with regard to the amorphous silicon film. However, it is preferable that a difference between two stages of the film thicknesses of the second undercoat insulating film 1006 is smaller than a film thickness of an amorphous semiconductor film formed thereafter. Further, it is preferable to etch the unnecessary portion in a taper shape such that an angle of a side wall at the stepped difference of the second undercoat insulating film 100*b* becomes equal to or larger than 5 degree or less than 85 degree (preferably, 30 degree through 60 degree) relative to the substrate 1001 to thereby ensure step coverage of a film laminated thereon.

An amorphous semiconductor film 101 shown in FIG. 11C is formed along the third undercoat insulating film 100*c* having the stepped difference by a thickness of 25 through 200 nm (preferably, 30 through 100 nm) by a publicly-known process of plasma CVD process or sputtering process. According to the embodiment, the amorphous silicon film is formed by a film thickness of 50 nm. Incidentally, as the amorphous semiconductor film, there is a noncrystalline semiconductor film or a microcrystal semiconductor film and a compound semiconductor film having an amorphous structure such as an amorphous silicon germanium film may be applied thereto.

FIG. 11C is a view for explaining a crystallizing step of irradiating laser beam from a rear face side. According to the invention, there is used either of methods of irradiating laser beam from a rear face side of the substrate and irradiating thereof from both sides of a surface side and the rear face side of the substrate, however, according to the embodiment, laser beam is irradiated from the rear face side of the substrate. In crystallizing by a laser annealing process, it is preferable to firstly discharge hydrogen included in the amorphous semiconductor film and the included hydrogen amount may be made equal to or smaller than 5 atom % by exposing the amorphous semiconductor film in a nitrogen atmosphere at 400 through 500° C. for about 1 hour. Thereby, laser resistance of the film is remarkably promoted.

An explanation will be given of a laser oscillator used in the laser annealing process. Excimer laser is provided with large output and can currently oscillate highly repeated pulses of about 300 Hz and therefore, the excimer laser is frequently used. Further, not only pulse- oscillated excimer laser but also continuously-oscillated excimer laser, Ar laser, YAG laser, $YVO_4$ laser or YLF laser can be used.

In this example, the amorphous silicon film is crystallized by the irradiation method of FIG. 11C by using excimer laser (wavelength: 308 nm, pulse width: 30 ns). As has already been described, the film thickness of the third undercoat insulating film 100*c* is of two stages and therefore, when laser beam is irradiated from the rear face side, reflectance of the laser beam with regard to the amorphous semiconductor film 1005 is about 22.7% at region A and about 62.5% at region B and effective intensities of laser beam therefor are different from each other.

Further, an end of a stepped difference in the third undercoat insulating film of FIG. 11C, is cooled faster than other location since there are both of (1) the undercoat insulating film right thereunder and (2) the undercoat insulating film present in the lateral direction as location of escaping heat. Therefore, solidification is started from a semiconductor film above the end of the stepped difference in the third undercoat insulating film 100*c* at which temperature is lowered initially and a nucleus of a crystal is produced. The nucleus constitutes center of crystal growth and the crystal growth is progressed toward a region in a molten state at high temperature. In this way, there can be formed a crystalline semiconductor film having crystal grains which are provided with large particle sizes and positions of which are controlled.

After irradiating laser beam, by subjecting the crystalline semiconductor film to a patterning processing using a photolithography process, semiconductor layers 102 through 106 are formed.

Further, after forming the semiconductor layers 102 through 106, there may be carried out doping of an impurity element (boron or phosphor) by a small amount in order to control a threshold.

Next, there is formed a gate insulating film 107 covering the semiconductor layers 102 through 106. The gate insulating film 107 is formed by an insulating film including silicon and having a thickness of 40 through 150 nm by using a plasma CVD process or a sputtering process. In this example, there is formed a silicon oxynitride film (composition ratios Si=32%, O=59%, N=7%, H=2%) by a thickness of 110 nm by a plasma CVD process. Naturally, the gate insulating film is not limited to the silicon oxynitride film but other insulating film including silicon may be used as a single layer or a laminated structure.

Further, when a silicon oxide film is used, TEOS (Tetraethyl Orthosilicate) and $O_2$ are mixed in a plasma CVD process, reaction pressure is set to 40Pa, substrate temperature is set to 300 through 400° C. and electricity is discharged at high frequency (13.56 MHz) and power density of 0.5 through 0.8 W/cm$^2$ to thereby enable to form the silicon oxide film. The silicon oxide film fabricated in this way can be provided with electric properties excellent as the gate insulating film by subjecting the film to thermal annealing at 400 through 500° C. thereafter.

Next, as shown by FIG. 11D, there are formed a first conductive film 108 having a film thickness of 20 through 100 nm and a second conductive film 109 having a film thickness of 100 through 400 nm to laminate above the gate insulating film 107. In this example, the first conductive film 108 comprising a TaN film having a film thickness of 30 nm and the second conductive film 109 comprising a W film having a film thickness of 370 nm are formed to laminate thereon. The TaN film is formed by a sputtering process, a target of Ta is used and sputtering is carried out in an atmosphere including nitrogen. Further, the W film is formed by a sputtering process using a target of W. Otherwise, the W film can be formed also by a thermal CVD process using tungsten hexafluoride ($WF_6$). In any way, it is necessary to achieve low resistance formation for using the film as a gate electrode and it is preferable that resistivity of the W film is equal to or smaller than 20 $\mu\Omega$cm. Although low resistance formation of the W film can be achieved by enlarging a crystal grain, when an impurity element such as oxygen is present by a large amount in the W film, crystallization is hampered and high resistance formation results. Therefore, according to the embodiment, the resistivity of 9 through 20 $\mu\Omega$cm can be realized by forming the W film by a sputtering process using a target of high purity W (purity: 99.9999%) such that an impurity is prevented from mixing from a gas phase in forming the film.

Further, although according to the example, the first conductive film 108 is constituted by TaN and the second conductive film 109 is constituted by W, the elements therefor are not particularly limited but the films may be formed by an element selected from Ta, W, Ti, Mo, Al, Cu, Cr and Nd or alloy materials or compound materials whose major component is constituted by the elements. Further, there may be used a semiconductor film represented by a crystalline silicon film doped with an impurity element such as phosphor. Further, an AgPdCu alloy may be used. Further, there may be constituted a combination of the first conductive film formed by a tantalum (Ta) film and the second conductive film formed by a W film, a combination of the first conductive film formed by a titanium nitride (TiN) film and the second conductive film formed by a W film, a combination of the first conductive film formed by a tantalum nitride (TaN) film and the second conductive film formed by an Al film or a combination of the first conductive film formed by a tantalum nitride (TaN) film and the second conductive film formed by a Cu film.

Next, there is carried out a first etching processing for forming masks 110 through 115 comprising resists by using a photolithography process and forming electrodes and wirings. The first etching processing is carried out by a first and a second etching condition. In this example, at the first etching condition, there is used an ICP (Inductivity Coupled Plasma) etching process, $CF_4$, $Cl_2$ and $O_2$ are used as etching gases, ratios of flow rates of the respective gases are set to 25/25/10 (sccm) and RF (13.56 MHz) power of 500 W is inputted to an electrode of a coil type under pressure of 1 Pa to thereby form plasma and carry out the etching. In this case, there is used a dry etching apparatus (Model: E645-□ ICP) using ICP made by Matsushita Denki Sangyo Co. Ltd. RF (13.56 MHz) power of 150 W is inputted to a substrate side (sample stage) to thereby apply substantially negative self bias voltage. By etching the W film by the first etching condition and there is formed an end portion of the first conductive layer in a taper shape.

Thereafter, without removing the masks 110 through 115 comprising resists, the first condition is changed to the second etching condition, $CF_4$ and $Cl_2$ are used as etching gases, ratios of flow rates of the respective gases are set to 30/30 (sccm), plasma is produced by inputting RF (13.56 MHz) power of 500 W to the electrode of the coil type under pressure of 1 Pa and etching is carried out for about 30 seconds. RF (13.56 MHz) of 20 W is inputted also to the substrate side (sample state) to thereby apply substantially negative self bias voltage. Under the second etching condition in which $CF_4$ and $Cl_2$ are mixed, both of the W film and the TaN film are etched to the same degree. Further, in order to carry out the etching without leaving residue on the gate insulating film, etching time period may be increased by a rate of about 10 through 20%.

According to the first etching processing, by making shapes of the masks comprising resists pertinent, owing to an effect of the bias voltage applied to the substrate side, end portions of the first and the second conductive layers are formed in a taper shape. Angle of the taper portion becomes 15 through 45. In this way, by the first etching processing, there are formed conductive layers 117 through 122 (first conductive layers 117a through 122a and second conductive layers 117b through 122b) having the first shape comprising the first conductive layer and the second conductive layer. Numeral 116 designates the gate insulating film and at regions which are not covered by the conductive layers 117 through 122 having the first shape, there are formed regions etched and thinned by about 20 through 50 nm.

Further, a first doping processing is carried out without removing the masks comprising resists to thereby add an impurity element providing n-type to the semiconductor layers. (FIG. 12A) The doping processing may be carried out by an ion doping process or an ion implantation process. The ion doping process is carried out under conditions of a dose amount of $1\times10^{13}$ through $5\times10^{15}$ atoms/cm$^2$ and acceleration voltage of 60 through 100 keV. In this example, the dose amount is set to 1.51015 atoms/cm$^2$ and the acceleration voltage is set to 80 keV. As an impurity element for providing n-type, there is used an element belonging to the 15 group, typically, phosphor (P) or arsenic (As) and in this case, phosphor (P) is used. In that case, the conductive layers 117 through 121 constitute masks against the impurity element for providing n-type and high concentration impurity regions 123 through 127 are formed self-adjustingly. The impurity element providing n-type is added to the high concentration impurity regions 123 through 127 by a concentration range of $1\times10^{20}$ through $1\times10^{21}$ atoms/cm$^3$.

Next, a second etching processing is carried out without removing the masks comprising resists. In this case, $CF_4$, $Cl_2$ and $O_2$ are used as etching gases and the W film is selectively etched. In this case, first conductive layers 128b through 133b are formed by the second etching processing. Meanwhile, the second conductive layers 117a through 122a are hardly etched to thereby form second conductive layers 128a through 133a. Next, a state of FIG. 12B is provided by carrying out a second doping processing. In the doping operation, the second conductive layers 117a through 122a are used as masks against an impurity element and the doping is carried out such that the impurity element is added to the semiconductor layer below the taper portion of the first conductive layer. In this way, there are formed impurity regions 134 through 138 overlapping the first conductive layer. A concentration of phosphor (P) added to the impurity region is provided with a gradual concentration gradient in accordance with a film thickness of the taper portion of the first conductive layer. Further, in the semiconductor layer overlapping the taper portions of the first conductive layers, although the impurity concentration is more or less lowered from an end portion of the taper portion of the first conductive layer toward an inner side thereof, the concentration stays substantially at the same degree. Further, the impurity element is added also to the first impurity regions 123 through 127 to thereby form impurity regions 139 through 143.

Next, there is carried out a third etching processing without removing the masks comprising resists. The third etching processing is carried out for partially etching the taper portion of the first conductive layer and reducing the region overlapping the semiconductor layer. The third etching is carried out by using $CHF_3$ as an etching gas and using a reactive ion etching process (RIE process). First conductive layers 144 through 139 are formed by the third etching. At this occasion, simultaneously, the insulating film 116 is also etched and insulating films 150a through 150e and 151 are formed.

By the third etching, there are formed impurity regions (LDD regions) 134a through 138a which do not overlap the first conductive layers 144 through 148. Further, the impurity regions (GOLD regions) 134b through 138b stay to overlap the first conductive layers 144 through 148.

In this way, according to the example, a difference between the impurity concentration at the impurity regions (GOLD regions) 134b through 138b overlapping the first conductive layers 144 through 148 and the impurity concentration of the impurity regions (LDD regions) 134a through 138a which do not overlap the first conductive layers 144 through 148, can be reduced and the reliability can be promoted.

Successively, after removing the masks comprising resists, there is carried out a third doping processing by newly forming masks 152 through 154 comprising resists. By the third doping processing, there are formed impurity regions 155 through 160 added with an impurity element for providing a conductive type reverse to the above-described one conductive type at semiconductor layers constituting activation layers of p-channel type TFTs. The impurity regions are formed self-adjustingly by adding the impurity element providing p-type by using the second conductive layers 128a through 132a as masks against the impurity element. In this example, the impurity regions 155 through 160 are formed by an ion doping process using diborane ($B_2H_6$). In the third doping processing, the semiconductor layers forming n-channel type TFTs are covered by the masks 152 through 154 comprising resists. Although the impurity regions 155 through 160 are added with phosphor at concentrations different from each other by the first doping processing and the second doping process, in any of the regions, by carrying out the doping processing such that the concentration of the impurity element for providing p-type falls in a range of $2 \times 10^{20}$ through $2 \times 10^{21}$ atoms/cm$^3$, the impurity regions function as source regions and drain regions of p-channel type TFTs and accordingly, no problem is posed. In this example, portions of the semiconductor layers constituting activation layers of p-channel type TFTs are exposed and accordingly, there is achieved an advantage that the impurity element (boron) is easy to add thereto.

The impurity regions are formed at the respective semiconductor layers by the above-described steps.

Next, a first interlayer insulating film 161 is formed by removing the masks 152 through 154 comprising resists. The first interlayer insulating film 161 is formed by an insulating film including silicon and having a thickness of 100 through 200 nm by using a plasma CVD process or a sputtering process. In this example, a silicon oxynitride film having a film thickness of 150 nm is formed by a plasma CVD process. Naturally, the first interlayer insulating film 161 is not limited to the silicon oxynitride film but other insulating film including silicon may be used as a single layer or a laminated structure.

Next, as shown by FIG. 13B, there is carried out a step of activating the impurity elements added to the respective semiconductor layers. The activating step is carried out by a thermal annealing process using a furnace annealing furnace. The thermal annealing process may be carried out in a nitrogen atmosphere having an oxygen concentration equal to or smaller than 1 ppm, preferably, equal to or smaller than 0.1 ppm at 400 through 700° C. representatively, 500 through 550 C. and in this example, the activation processing is carried out by a heat treatment at 550° C. for 4 hours. Further, other than the thermal annealing process, a laser annealing process or a rapid thermal annealing process (RTA process) is applicable.

Further, in this example, simultaneously with the activation processing, nickel used as a catalyst in the crystallizing step, is gettered by impurity regions 139, 141, 142, 155 and 158 including a high concentration of phosphor and a nickel concentration in the semiconductor layer mainly constituting a channel-forming region is reduced. According to TFT having the channel forming region fabricated in this way, the off current value is reduced, crystalline performance is excellent and therefore, there is provided high field effect mobility and excellent electric properties can be achieved.

Further, the activation processing may be carried out prior to forming the first interlayer insulating film. However, when a wiring material used is weak at heat, it is preferable to carry out the activation processing after forming the interlayer insulating film (insulating film whose major component is silicon, for example, silicon nitride film) for protecting wirings as in the example.

Further, there is carried out a step of hydrogenating the semiconductor layer by carrying out a heat treatment in an atmosphere including 3 through 100% of hydrogen at 300 through 550° C. for 1 through 12 hours. In this example, there is carried out a heat treatment in a nitrogen atmosphere including about 3% of hydrogen at 410° C. for 1 hour. The step is a step of terminating dangling bond of the semiconductor layer by hydrogen included in the interlayer insulating film. As other means of hydrogenation, there may be carried out plasma hydrogenation (using hydrogen excited by plasma).

Further, when a laser annealing process is used as an activation processing, it is preferable to irradiate laser beam of excimer laser or YAG laser after carrying out the hydrogenation.

Next, there is formed a second interlayer insulating film 162 comprising an inorganic insulating material or an organic insulating material above the first interlayer insulating film 161. In this example, there is formed a acrylic resin film having film thickness of 1.6 µm and there is used a film having a viscosity of 10 through 1000 cp, preferably, 40 through 200 cp and formed with projections and recesses at a surface thereof. Further, as the second interlayer insulating film 162, there may be used a film having a flattened surface.

In this example, there are formed projections and recesses at a surface of a pixel electrode by forming the second interlayer insulating film formed with projections and recesses at the surface in order to prevent mirror face reflection. Further, a projected portion may be formed at a region below the pixel electrode in order to achieve light scattering performance by providing recesses and projections at the surface of the pixel electrode. In that case, the projected portion is formed by using a photomask the same as that for forming TFT and therefore, the projected portion can be formed without increasing a number of steps. Further, the projected portion may pertinently be provided above the substrate at a region of a pixel portion other than wirings and TFT portions. In this way, projections and recesses are formed at the surface of the pixel electrode along projections and recesses formed at the insulating film covering the projected portion.

Further, in a drive circuit there are formed wirings 163 through 167 respectively connected electrically to the respective impurity regions. Further, these wirings are formed by patterning a laminated layer of a Ti film having a film thickness of 50 nm and an alloy film (alloy film of Al and Ti) having a film thickness of 500 nm.

Further, at a pixel portion, there are formed a pixel electrode 170, a gate wiring 169 and a connection electrode 158. (FIG. 13C) By the connection electrode 168, a source wiring (laminated layer of 143b and 149) is electrically connected to a pixel TFT. Further, the gate wiring 169 is electrically connected to a gate electrode of the pixel TFT. Further, the pixel electrode 170 is electrically connected to a drain region of the pixel TFT and is electrically connected to the semiconductor layer 158 functioning as one electrode forming a storage capacitor. Further, it is preferable to use a material excellent in reflectivity such as a film whose major component is Al or Ag or a laminated film of these for the pixel electrode 170.

In this way, there can be formed a drive circuit 506 having a CMOS circuit comprising n-channel type TFT 501 and p-channel type TFT 502 and n-channel type TFT 503 and a pixel portion 507 having a pixel TFT 504 and a storage capacitor 505 above the same substrate. Thereby, an active matrix substrate is finished.

The n-channel type TFT 501 of the drive circuit 506 is provided with a channel forming region 171, the low concentration impurity region 134b (GOLD region) overlapping the first conductive layer 144 constituting a portion of the gate electrode, the low concentration impurity region 134a (LDD region) formed on an outer side of the gate electrode and the high concentration impurity region 139 functioning as the source region or the drain region. The p-channel type TFT 502 forming the CMOS circuit by being connected to the n-channel type TFT 501 by the electrode 166, is provided with a channel forming region 172, the impurity region 157 overlapping the gate electrode, the impurity region formed on an outer side of the gate electrode and the high concentration impurity region 155 functioning as the source region or the drain region. Further, n-channel type TFT 503 is provided with a channel forming region 173, the low concentration impurity region 136b (GOLD region) overlapping the first conductive layer 146 constituting a portion of the gate electrode, the low concentration impurity region 137a (LDD region) formed on an outer side of the gate electrode and the high concentration impurity region 141 functioning as the source region or the drain region.

The pixel TFT 504 of the pixel portion is provided with a channel forming region 174, the low concentration impurity region 137b (GOLD region) overlapping the first conductive layer 147 constituting a portion of the gate electrode, the low concentration impurity region 137a (LDD region) formed on an outer side of the gate electrode and the high concentration impurity region 142 functioning as the source region or the drain region. Further, semiconductor layers 158 through 160 functioning as one electrode of the storage capacitor 505, are respectively added with the impurity element for providing p-type. The storage capacitor 505 is formed by an electrode (laminated layer of 148 and 132b) and the semiconductor layers 158 through 160 with the insulating film 151 as the dielectric member.

Further, according to a pixel structure of the embodiment, an end portion of the pixel electrode is formed to arrange to overlap a source wiring such that a clearance between the pixel electrodes is shielded without using a black matrix.

Figure 14:
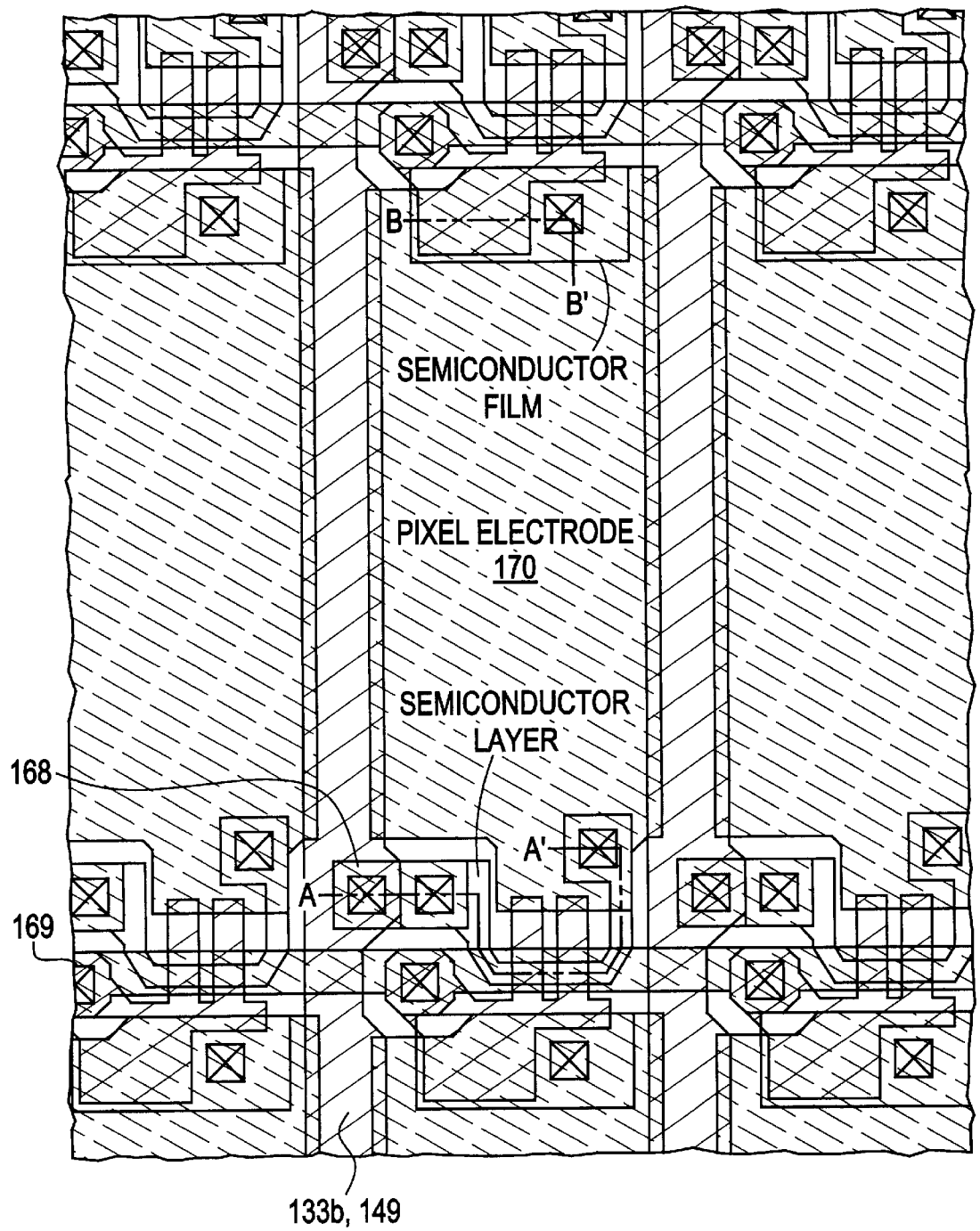
FIG. 14 is a top view showing a pixel of a pixel portion.

FIG. 14 shows a top view of the pixel portion of the active matrix substrate fabricated by the example. Further, the same notations are used for portions thereof in correspondence with those in FIG. 11 through FIG. 13. A chain line A–A' in FIG. 13 corresponds to a sectional view at by a chain line A–A' in FIG. 14. Further, a chain line B–B' in FIG. 13 corresponds to a sectional view cut by a chain line B–B' in FIG. 14.

Further, by following the steps shown in the example, a number of photomasks necessary for fabricating the active matrix substrate can be 5 sheets. As a result, the steps are shortened, which contributes to a reduction in the fabrication cost and promotion in yield.

Example 4

Figure 15:
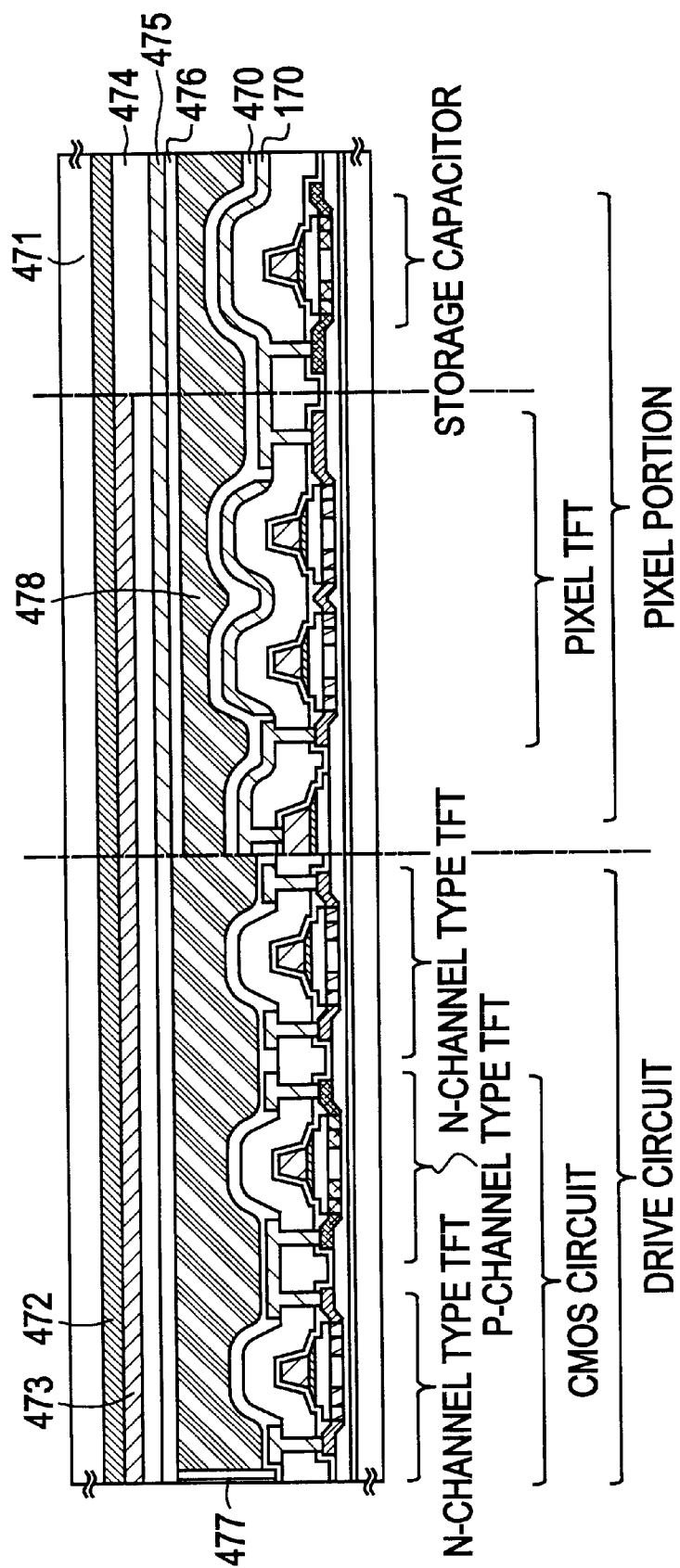
FIG. 15 is a sectional view showing a step of fabricating an active matrix type liquid crystal display apparatus.

In this example, an explanation will be given as follows of steps of fabricating a reflection type liquid crystal display apparatus from the active matrix substrate fabricated in Example 3. FIG. 15 is used in the explanation.

First, in accordance with Example 3, there is provided the active matrix substrate in the state of FIG. 13C and thereafter, an alignment film 470 is formed above the active matrix substrate of FIG. 13C, at least above the pixel electrode 170 and a rubbing processing is carried out. Further, in this example, before forming the alignment film 470, by patterning an organic resin film such as an acrylic resin film, spacers in a columnar shape (not illustrated) are formed at desired positions in order to maintain an interval between substrates. Further, in place of the spacers in the columnar shape, spacers in a spherical shape may be scattered over an entire face of the substrate.

Next, an opposed substrate 471 is prepared. Successively, there are formed color layers 472 and 473 and a flattening film 473. A light shielding portion is formed by overlapping the color layer 472 of red color and the color layer 473 of blue color. Further, the light shielding portion may be formed by overlapping portions of a color layer of red color and a color layer of green color.

In this example, there is used the substrate shown in Example 3. Therefore, in FIG. 14 showing the top view of the pixel portion of Example 3, it is necessary to shield at least a clearance between the gate wiring 169 and the pixel electrode 170, a clearance between the gate wiring 169 and the connection electrode 168 and a clearance between the connection electrode 168 and the pixel electrode 170. In this example, the respective color layers are arranged such that the light shielding portions constituted by laminating the color layers overlap positions to be shielded and the opposed substrate is pasted thereto.

A number of steps can be reduced by shielding the clearances among the respective pixels by the light shielding portions constituted by laminating the color layers in this way without forming light shielding layers such as black masks.

Next, the opposed electrode 475 constituted by a transparent conductive film is formed on the flattening film 474 at least at the pixel portion, an alignment film 476 is formed over an entire face of the opposed substrate and the rubbing processing is carried out.

Further, the active matrix substrate formed with the pixel portion and the drive circuit and the opposed substrate are pasted together by a seal member 477. The seal member 477 is mixed with a filler and two sheets of the substrates are pasted together at a uniform interval therebetween by the filler and the spacers in the columnar shape. Thereafter, the interval between the two substrates is injected with a liquid crystal material 478 and is completely sealed by a seal agent (not illustrated). A publicly-known liquid crystal material may be used for the liquid crystal material 478. In this way, the reflection type liquid crystal display apparatus shown in FIG. 15 is finished. Further, as necessary, the active matrix substrate or the opposed substrate may be divided into a desired shape. Further, a polarizer (not illustrated) is pasted to only the opposed substrate. Further, FPC is pasted thereto by using publicly-known technology.

The liquid crystal display panel fabricated in this way can be used as display portions of various electronic apparatus.

Example 5

The CMOS circuit and the pixel portion formed by implementing the invention can be used in various electro-optic apparatus (active matrix type liquid crystal display, active matrix type EC display, active matrix type EL display). That is, the present invention can be implemented in all of electronic apparatus integrated with the electro-optic apparatus at display portions thereof.

As such electronic apparatus, there are pointed out a video camera, a digital camera, a projector (rear type or front type), a head mount display (goggle type display), a car navigation system, a car stereo, a personal computer, a portable information terminal (mobile computer, portable telephone or electronic book) and the like. Examples of these are shown in FIGS. 16A through 16F, FIGS. 17A through 17D and FIGS. 18A through 18C.

Figure 16A:
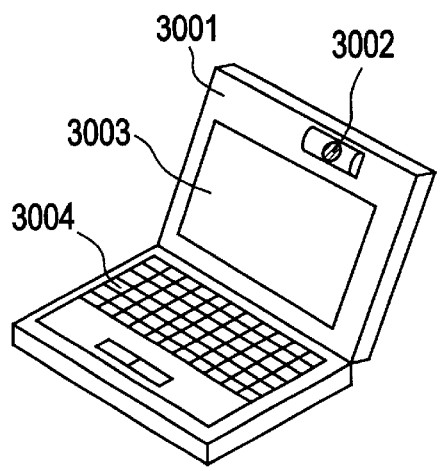
FIGS. 16A, 16B, 16C, 16D, 16E and 16F are views showing examples of semiconductor apparatus.

FIG. 16A shows a personal computer including a main body 3001, an image input portion 3002, a display portion 3003 and a keyboard 3004. The invention is applicable to signal control circuits of the image input portion 3002 and the display portion 3003.

Figure 16B:
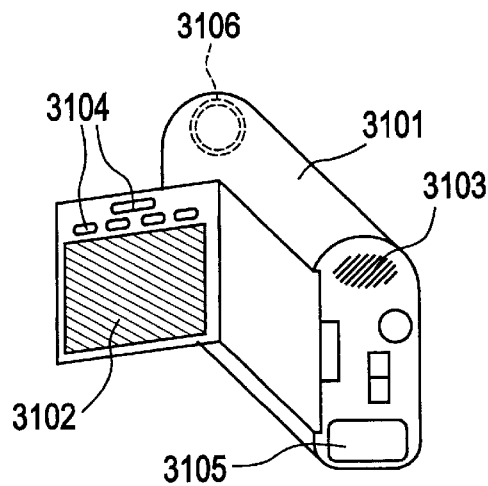

FIG. 16B shows a video camera including a main body 3101, a display portion 3102, a voice input portion 3103, operation switches 3104, a battery 3105 and an image receiving portion 3106. The invention is applicable to a signal control circuit of the display portion 3102.

Figure 16C:
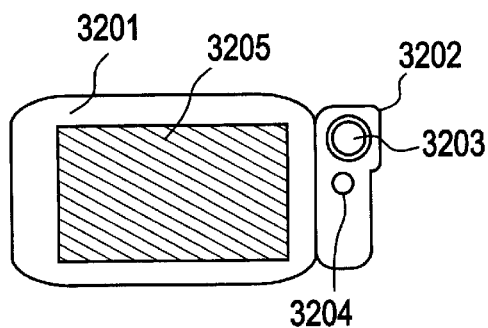

FIG. 16C shows a mobile computer including a main body 3201, a camera portion 3202, an image receiving portion 3203, an operation switch 3204 and a display portion 3205. The invention is applicable to a signal control circuit of the display portion 3205.

Figure 16D:
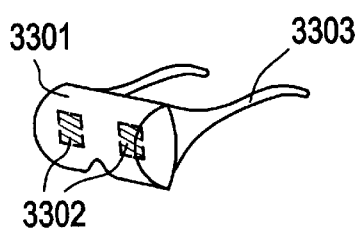

FIG. 16D shows a goggle type display including a main body 3301, a display portion 3302 and an arm portion 3303. The invention is applicable to a signal control circuit of the display portion 3302.

Figure 16E:
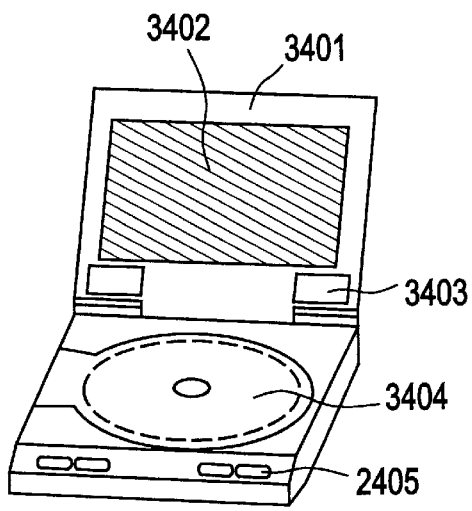

FIG. 16E shows a player using a record medium recorded with programs (hereinafter, referred to as record medium) including a main body 3401, a display portion 3402, a speaker portion 3403, a record medium 3404 and an operation switch 3405. The player uses DVD (digital Versatile Disc) or CD as the record medium and can enjoy music, enjoy movie and carry out game or internet. The invention is applicable to a signal control circuit of the display portion 3402.

Figure 16F:
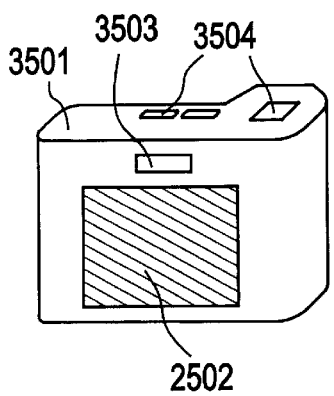

FIG. 16F shows a digital camera including a main body 3501, a display portion 3502, an eye contact portion 3503, operation switches 3504 and an image receiving portion (not illustrated). The invention is applicable to a signal control circuit of the display portion 3502.

Figure 17A:
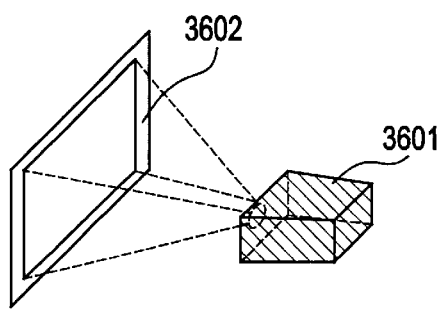
FIGS. 17A, 17B, 17C and 17D are views showing examples of semiconductor apparatus.

FIG. 17A shows a front type projector including a projection apparatus 3601 and a screen 3602. The invention is applicable to a signal control circuit of a liquid crystal display apparatus 3808 constituting a portion of the projection apparatus 3601.

Figure 17B:
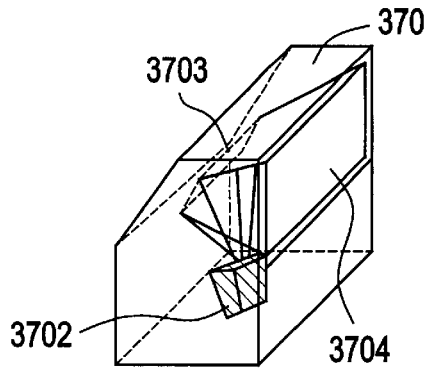

FIG. 17B shows a rear type projector including a main body 3701, a projection apparatus 3702, a mirror 3703 and a screen 3704. The invention is applicable to a signal control circuit of the liquid crystal display apparatus 3808 constituting a portion of the projection apparatus 3702.

Figure 17C:
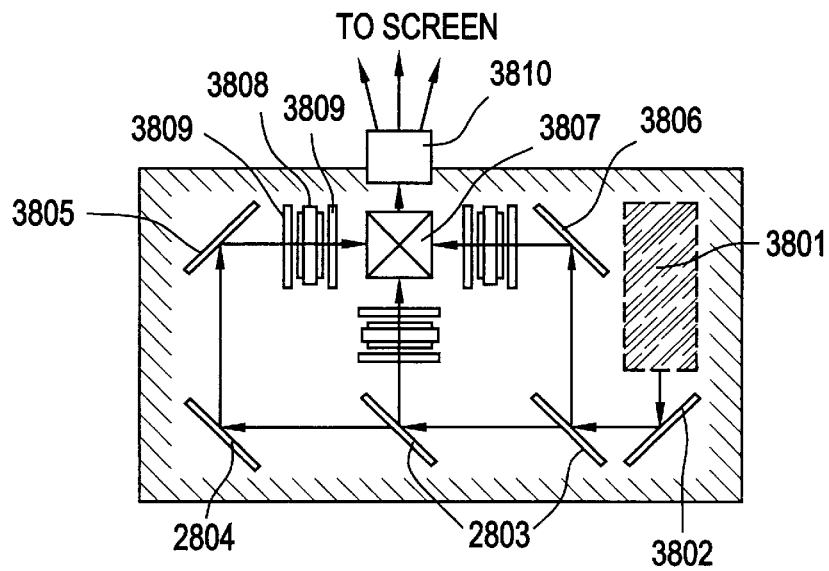

Further, FIG. 17C is a view showing an example of a structure of the projection apparatus 3601 and 3702 in FIG. 17A and FIG. 17B. The projection apparatus 3601 or 3702 is constituted by a light source optical system 3801, mirrors 3802, and 3804 through 3806, a dichroic mirror 3803, a prism 3807, a liquid crystal display apparatus 3808, a phase difference plate 3809 and a projection optical system 3810. The projection optical system 3810 is constituted by an optical system including a projection lens. Although the embodiment shows an example of three plates type, the embodiment is not particularly limited there to but maybe of, for example, a single plate type. Further, a person of executing the embodiment may pertinently provide an optical system such as an optical lens, a film having a polarization function, a film for adjusting a phase difference or an IR film in an optical path shown by arrow marks in FIG. 17C.

Figure 17D:
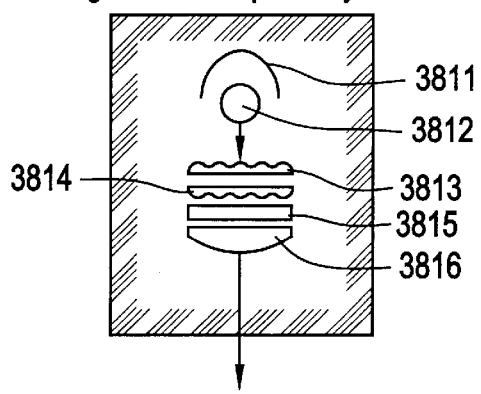

Further, FIG. 17D is a view showing an example of a structure of the light source optical system 3801 in FIG. 17C. According to the embodiment, the light source optical system 3801 is constituted by a reflector 3811, a light source 3812, lens arrays 3813 and 3814, a polarization conversion element 3815 and a focusing lens 3816. Further, the light source optical system shown in FIG. 17D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIGS. 17A, 17B and 17C, there is shown a case of using a transmission type electro-optic apparatus and an example of applying a reflection type electro-optic apparatus is not illustrated.

Figure 18A:
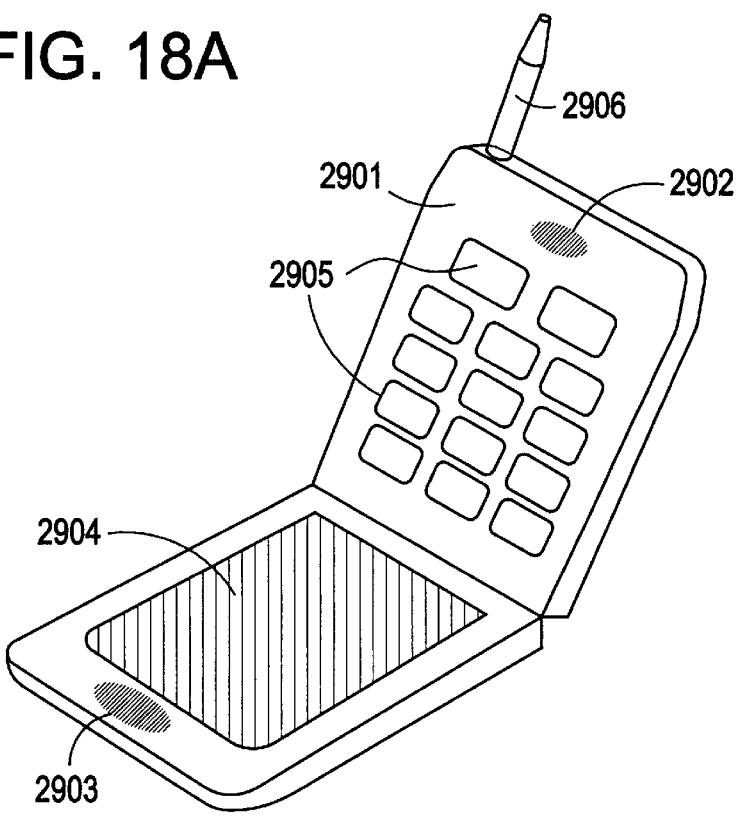
FIGS. 18A, 18B and 18C are views showing examples of semiconductor apparatus.

FIG. 18A shows a portable telephone including a main body 3901, a voice output portion 3902, a voice input portion 3903, a display portion 3904, an operation switch 3905 and an antenna 3906. The invention is applicable to signal control circuits of the voice output portion 3902, the voice input portion 3903 and the display portion 3904.

Figure 18B:
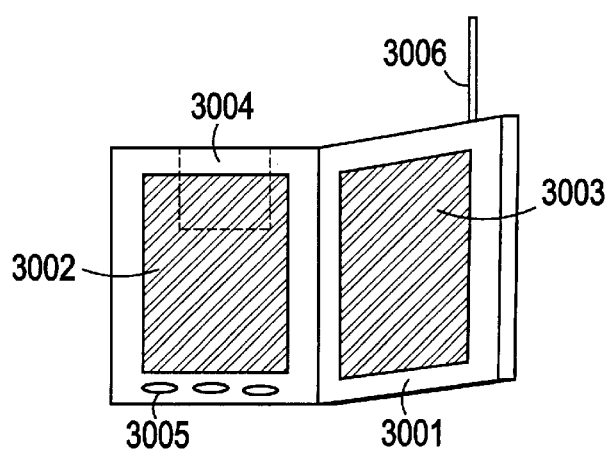

FIG. 18B shows a portable book (electronic book) including a main body 4001, display portions 4002 and 4003, a record medium 4004, an operation switch 4005 and an antenna 4006. The invention is applicable to signal circuits of the display portions 4002 and 4003.

Figure 18C:
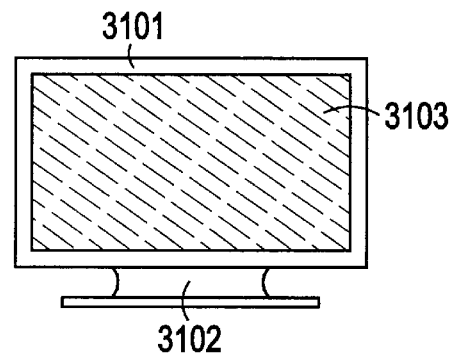

FIG. 18C shows a display including a main body 4101, a support base 4102 and a display portion 4103. The invention is applicable to the display portion 4103. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields. Further, the electronic apparatus of the embodiment can be realized by using any constitution comprising any combinations of Examples 1 through 4.

By adopting the constitution of the invention, basic significance shown below can be achieved.

(a) The constitution is constructed by a simple structure completely adapted to the process of fabricating conventional TFT.

(b) The film thickness and the refractive index of the undercoat insulating film can be controlled simply and finely. Therefore, the intensity distribution of laser beam is easy to be subjected to position control finely.

(c) It is not necessary to provide particular fine positioning technology of a micrometer order for a laser irradiating apparatus in order to position a slit and an ordinary laser irradiating apparatus can be utilized as it is.

(d) The constitution provides a method capable of producing crystal grains having large particle sizes positions of which are controlled after satisfying the above-described advantages.

What is claimed is:

1. A method of fabricating a semiconductor device comprising the steps of:

forming a first undercoat insulating film having a refractive index different from a refractive index of a substrate over the substrate having a light transmitting performance;

forming a second undercoat insulating film having a refractive index different from the refractive index of the first undercoat insulating film over the first undercoat insulating film;

forming a plurality of recessed portions by partially etching the second undercoat insulating film;

forming an amorphous semiconductor film over the second undercoat insulating film formed with the plurality of recessed portions; and forming a crystalline semiconductor film by irradiating a laser beam from a rear face side of the substrate or both sides of a surface side and the rear face side of the substrate to the amorphous semiconductor film;

wherein the crystalline semiconductor film formed over the recessed portions is made to constitute a channel forming region of TFT.

2. The method according to claim 1 wherein the semiconductor device is a liquid crystal display apparatus or an EL display apparatus.

3. The method according to claim 1 wherein the semiconductor device is any of a portable telephone, a video camera, a digital camera, a projector, a goggle type display, a personal computer, a DVD player, an electronic book and a portable type information terminal.

4. A semiconductor device formed by the steps of:

forming a first undercoat insulating film having a refractive index different from a refractive index of a substrate over the substrate having a light transmitting performance;

forming a second undercoat insulating film having a refractive index different from the refractive index of the first undercoat insulating film and having a plurality of recessed portions over the first undercoat insulating film;

forming an amorphous semiconductor film over the second undercoat insulating film; and forming a crystalline semiconductor film by irradiating a laser beam to the amorphous semiconductor film;

wherein the crystalline semiconductor film over the recessed portions are made to constitute a channel forming region of TFT.

5. The device according to claim 4 wherein the semiconductor device is a liquid crystal display apparatus or an EL display apparatus.

6. The device according to claim 4 wherein the semiconductor device is any of a portable telephone, a video camera, a digital camera, a projector, a goggle type display, a personal computer, a DVD player, an electronic book and a portable type information terminal.

* * * * *

UNITED STATES PATENT AND TRADEMARK OFFICE
CERTIFICATE OF CORRECTION

PATENT NO.         : 6,746,901 B2
APPLICATION NO. : 09/847596
DATED                  : June 8, 2004
INVENTOR(S)        : Kenji Kasahara et al.

It is certified that error appears in the above-identified patent and that said Letters Patent is hereby corrected as shown below:

In the drawings, Sheets 2, 3 and 10 of 18, replace Figs. 2A, 2B, 3A, 3B, 10A and 10B with the attached replacement Figs. 2A, 2B, 3A, 3B, 10A and 10B, each of which includes a broken line indicating the "ABSORPTION RATE WITH REGARD TO a-Si."

UNITED STATES PATENT AND TRADEMARK OFFICE
CERTIFICATE OF CORRECTION

PATENT NO. : 6,746,901 B2
APPLICATION NO. : 09/847596
DATED : June 8, 2004
INVENTOR(S) : Kenji Kasahara et al.

It is certified that error appears in the above-identified patent and that said Letters Patent is hereby corrected as shown below:

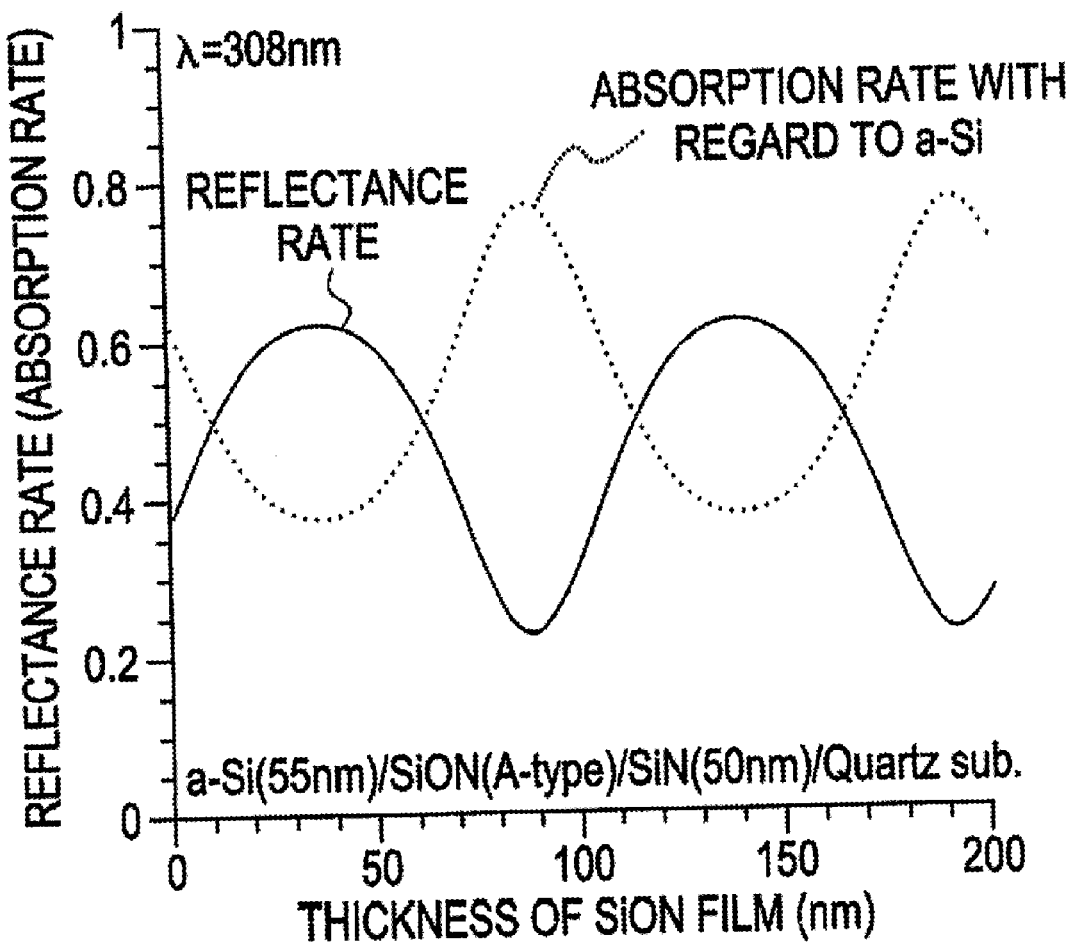

UNITED STATES PATENT AND TRADEMARK OFFICE
CERTIFICATE OF CORRECTION

PATENT NO. : 6,746,901 B2
APPLICATION NO. : 09/847596
DATED : June 8, 2004
INVENTOR(S) : Kenji Kasahara et al.

It is certified that error appears in the above-identified patent and that said Letters Patent is hereby corrected as shown below:

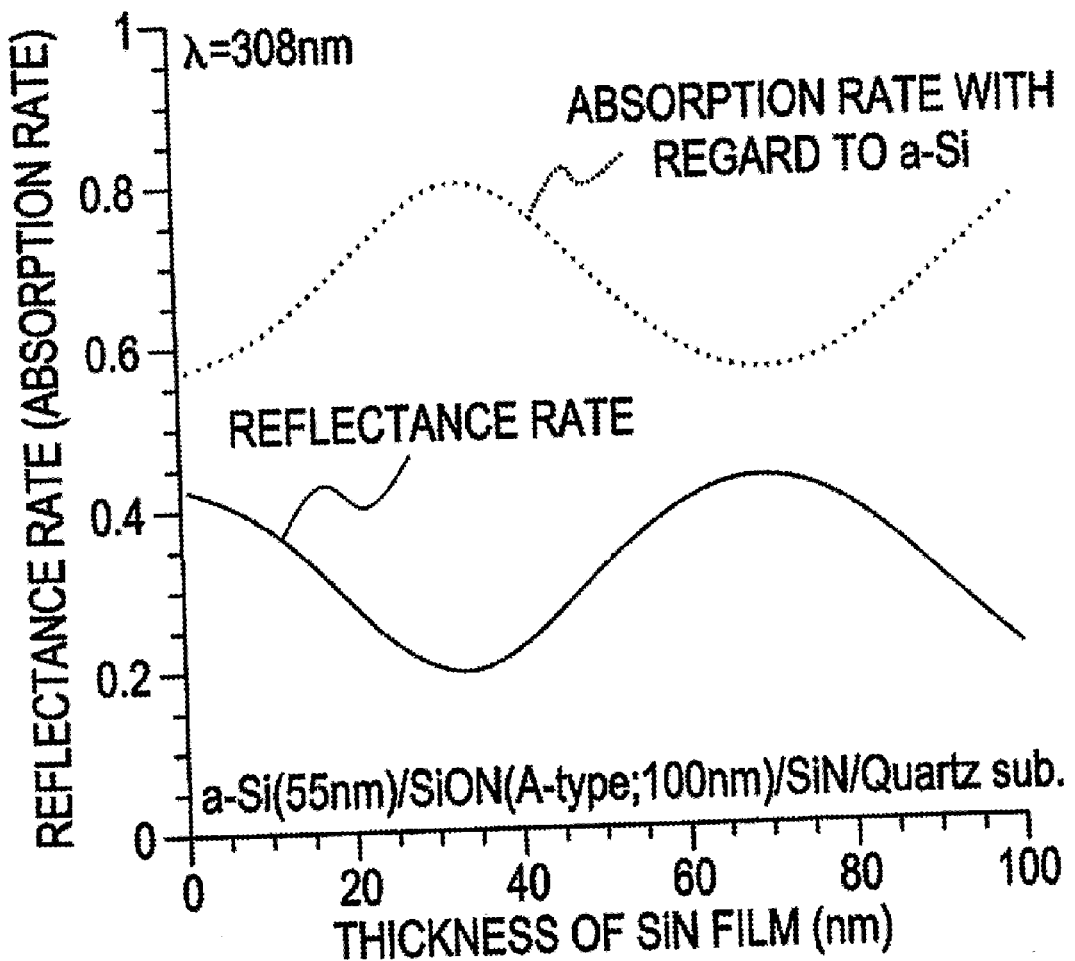

UNITED STATES PATENT AND TRADEMARK OFFICE
CERTIFICATE OF CORRECTION

PATENT NO.        : 6,746,901 B2                                           Page 4 of 7
APPLICATION NO.   : 09/847596
DATED             : June 8, 2004
INVENTOR(S)       : Kenji Kasahara et al.

It is certified that error appears in the above-identified patent and that said Letters Patent is hereby corrected as shown below:

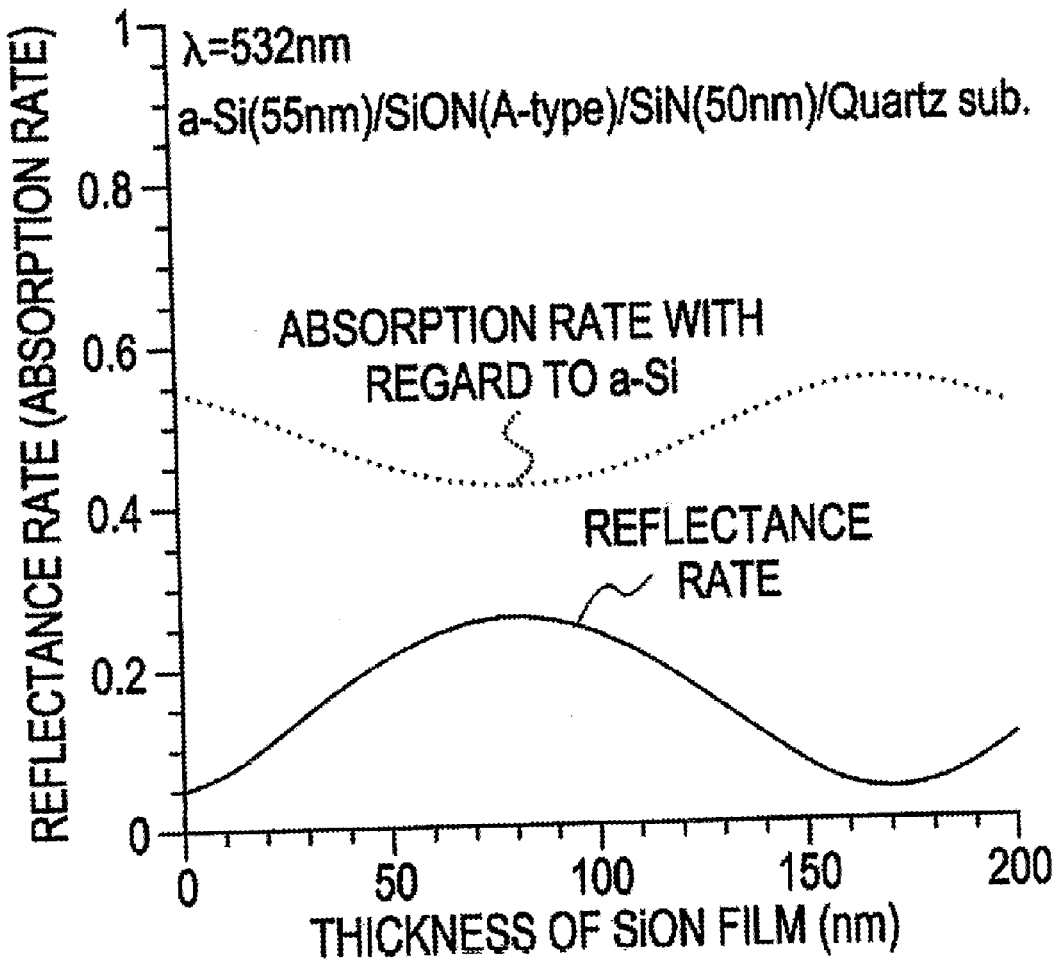

UNITED STATES PATENT AND TRADEMARK OFFICE
CERTIFICATE OF CORRECTION

PATENT NO. : 6,746,901 B2
APPLICATION NO. : 09/847596
DATED : June 8, 2004
INVENTOR(S) : Kenji Kasahara et al.

It is certified that error appears in the above-identified patent and that said Letters Patent is hereby corrected as shown below:

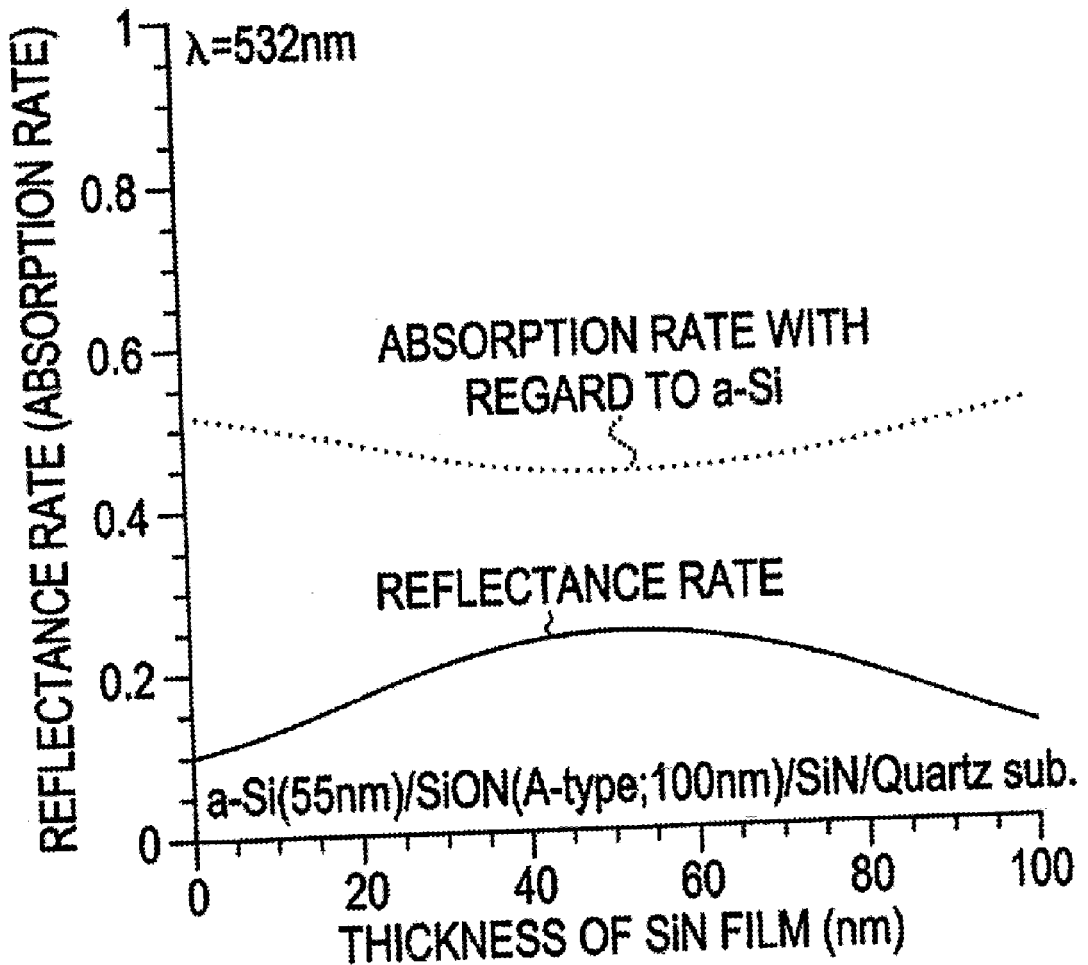

UNITED STATES PATENT AND TRADEMARK OFFICE
CERTIFICATE OF CORRECTION

PATENT NO. : 6,746,901 B2
APPLICATION NO. : 09/847596
DATED : June 8, 2004
INVENTOR(S) : Kenji Kasahara et al.

It is certified that error appears in the above-identified patent and that said Letters Patent is hereby corrected as shown below:

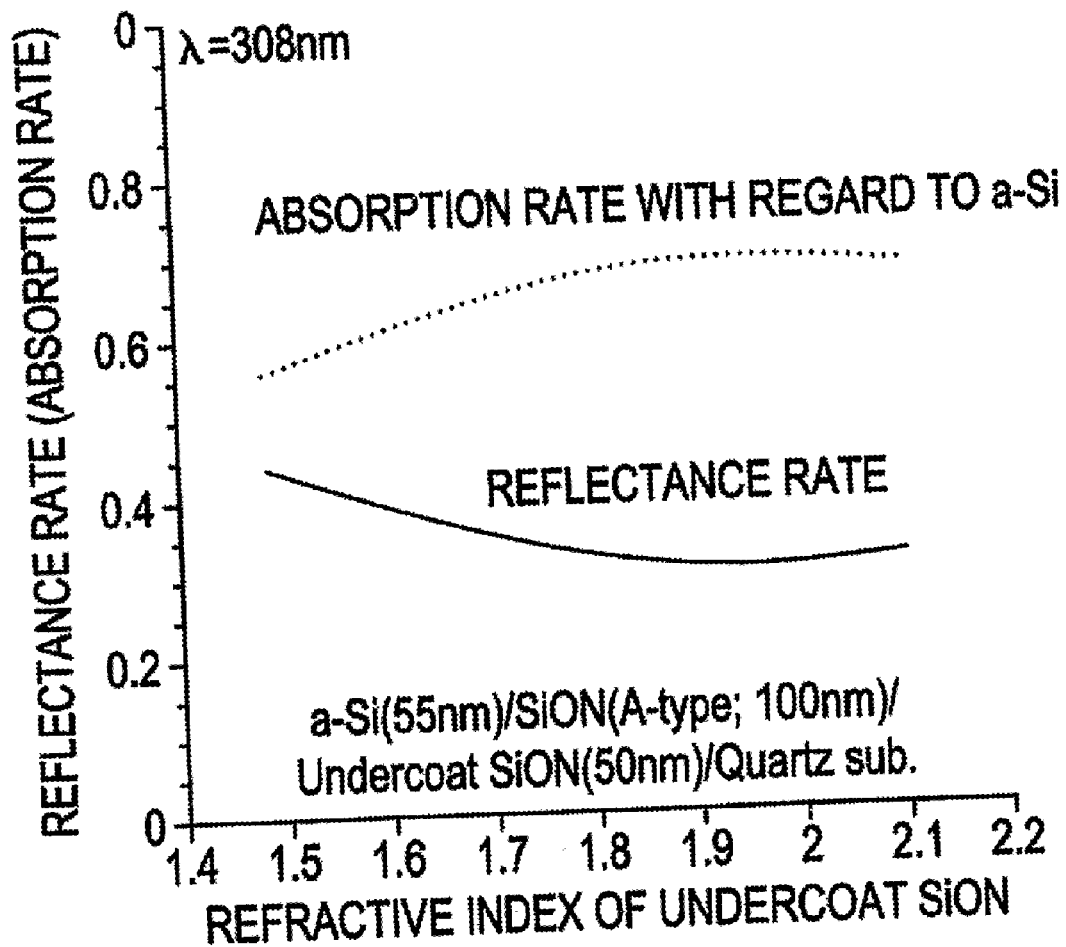

UNITED STATES PATENT AND TRADEMARK OFFICE
CERTIFICATE OF CORRECTION

PATENT NO. : 6,746,901 B2
APPLICATION NO. : 09/847596
DATED : June 8, 2004
INVENTOR(S) : Kenji Kasahara et al.

It is certified that error appears in the above-identified patent and that said Letters Patent is hereby corrected as shown below:

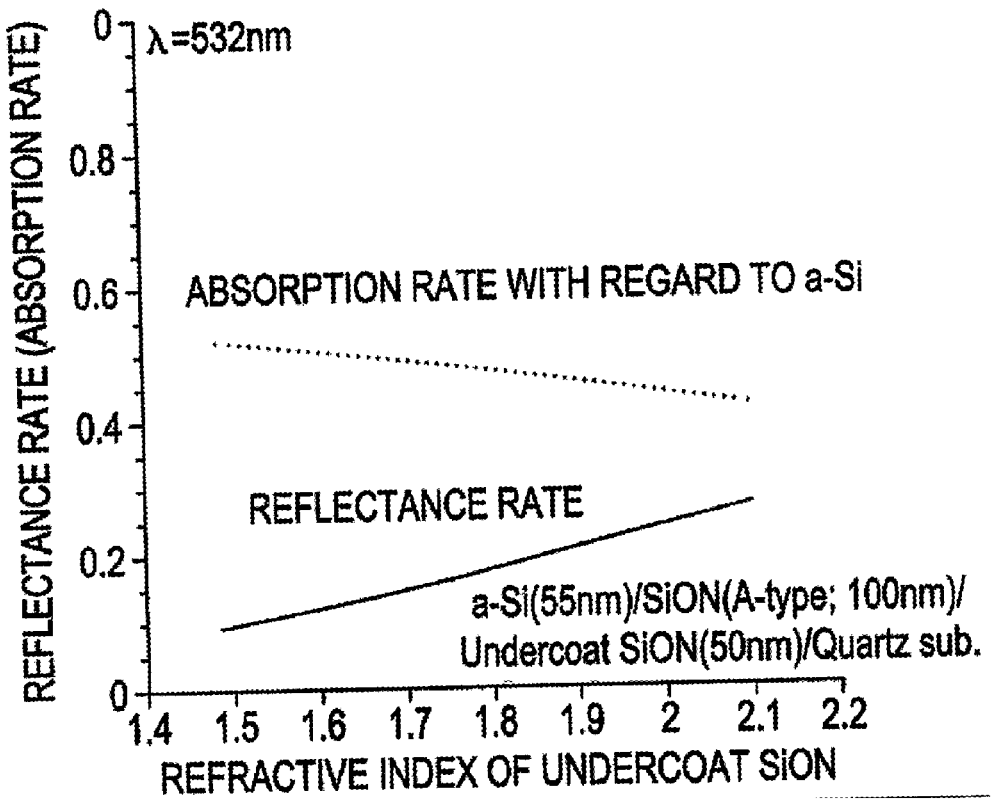

Signed and Sealed this

Twenty-first Day of November, 2006

JON W. DUDAS
*Director of the United States Patent and Trademark Office*